US 12,074,186 B2

(12) United States Patent
Cheng et al.

(10) Patent No.: US 12,074,186 B2
(45) Date of Patent: Aug. 27, 2024

(54) ISOLATION EPITAXIAL BI-LAYER FOR BACKSIDE DEEP TRENCH ISOLATION STRUCTURE IN AN IMAGE SENSOR

(71) Applicant: Taiwan Semiconductor Manufacturing Co., Ltd., Hsinchu (TW)

(72) Inventors: Yu-Hung Cheng, Tainan (TW); Ching I Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 289 days.

(21) Appl. No.: 17/352,919

(22) Filed: Jun. 21, 2021

(65) Prior Publication Data
US 2022/0293642 A1  Sep. 15, 2022

Related U.S. Application Data

(60) Provisional application No. 63/160,205, filed on Mar. 12, 2021.

(51) Int. Cl.
*H01L 27/146* (2006.01)
(52) U.S. Cl.
CPC ...... *H01L 27/1463* (2013.01); *H01L 27/1464* (2013.01); *H01L 27/14685* (2013.01)
(58) Field of Classification Search
CPC .................................. H01L 27/1463
See application file for complete search history.

(56) References Cited

U.S. PATENT DOCUMENTS

| 10,147,756 B2 * | 12/2018 | Cheng | H05K 999/99 |
| 10,790,322 B1 | 9/2020 | Wang et al. | |
| 11,817,469 B2 * | 11/2023 | Cheng | H01L 27/1463 |
| 2012/0086064 A1 * | 4/2012 | Cheng | H01L 28/84 |
| | | | 438/389 |

(Continued)

OTHER PUBLICATIONS

Kim et al. "A 1/2.65in 44Mpixel CMOS Image Sensor with 0.782 m Pixels Fabricated in Advanced Full-Depth Deep-Trench Isolation Technology" 2020 IEEE International Solid-State Circuits Conference, published on Feb. 17, 2020.

(Continued)

*Primary Examiner* — Mounir S Amer
*Assistant Examiner* — Alexander Belousov
(74) *Attorney, Agent, or Firm* — Eschweiler & Potashnik, LLC

(57) ABSTRACT

In some embodiments, the present disclosure relates to an integrated chip, including a substrate, a first image sensing element and a second image sensing element arranged next to one another over the substrate, the first image sensing element and the second image sensing element having a first doping type, and a backside deep trench isolation (BDTI) structure arranged between the first and second image sensing elements and including a first isolation epitaxial layer setting an outermost sidewall of the BDTI structure and having the first doping type, a second isolation epitaxial layer arranged along inner sidewalls of the first isolation epitaxial layer and having a second doping type different than the first doping type, and an isolation filler structure filling between inner sidewalls of the second isolation epitaxial layer.

20 Claims, 22 Drawing Sheets

(56) References Cited

U.S. PATENT DOCUMENTS

| | | | |
|---|---|---|---|
| 2017/0110327 A1* | 4/2017 | Kim | H01L 21/3065 |
| 2019/0067355 A1 | 2/2019 | Li et al. | |
| 2019/0103504 A1* | 4/2019 | Yamashita | H01L 27/14636 |
| 2019/0165009 A1 | 5/2019 | Wu et al. | |
| 2021/0225924 A1* | 7/2021 | Mun | H01L 27/14612 |
| 2022/0230909 A1* | 7/2022 | Li | H01L 21/76205 |
| 2022/0293642 A1* | 9/2022 | Cheng | H01L 27/1463 |

OTHER PUBLICATIONS

Kitamura et al. "Suppression of Crosstalk by Using Backside Deep Trench Isolation for 1.12μm Backside Illuminated CMOS Image Sensor" IEEE 2012 International Electron Devices Meeting, published on Mar. 14, 2013.

\* cited by examiner

ISOLATION EPITAXIAL BI-LAYER FOR BACKSIDE DEEP TRENCH ISOLATION STRUCTURE IN AN IMAGE SENSOR

REFERENCE TO RELATED APPLICATION

This Application claims the benefit of U.S. Provisional Application No. 63/160,205, filed on Mar. 12, 2021, the contents of which are hereby incorporated by reference in their entirety.

BACKGROUND

Many modern day electronic devices, such as digital cameras and video cameras, contain image sensors to convert optical images to digital data. An image sensor comprises an array of pixel regions. Each pixel region contains a photodiode configured to capture optical signals (e.g., light) and convert it to digital data (e.g., a digital image). Complementary metal-oxide-semiconductor (CMOS) image sensors (CIS) are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
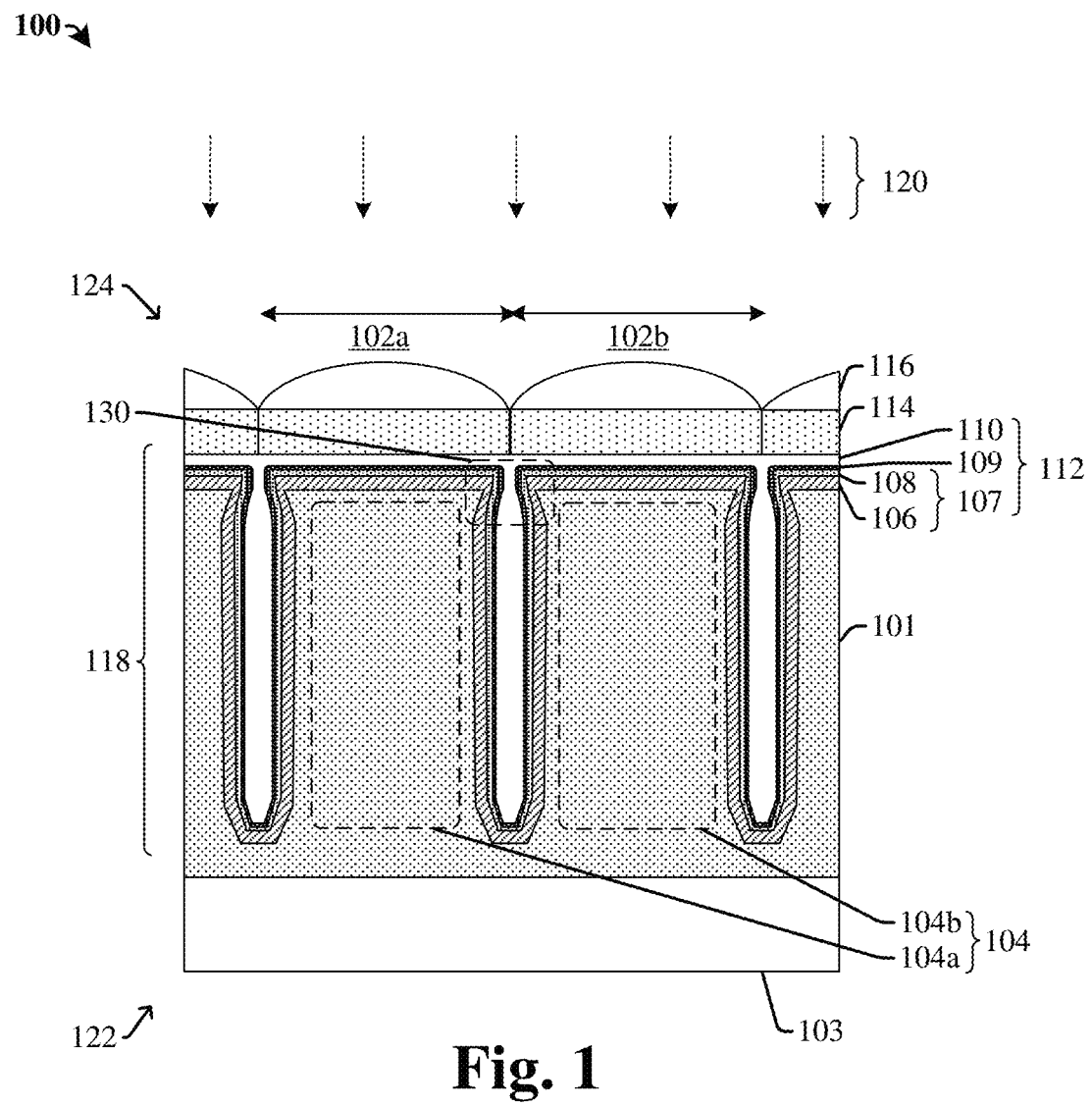
FIG. 1 illustrates a cross-sectional view of some embodiments of an image sensor having an image sensing element surrounded by a BDTI structure with an isolation epitaxial bi-layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor (CIS) device includes a plurality of pixel regions arranged on or within a substrate. Each pixel region comprises an image sensing element, such as a photodiode, that is configured to receive incident light comprising photons. The pixel regions may be separated from one another by a backside deep trench isolation (BDTI) structure to improve the quantum efficiency of the CIS.

Integrated chip technologies are constantly being improved. Such improvements frequently involve scaling down device geometries to achieve lower fabrication costs, higher device integration density, higher speeds, and better performance. Due to device scaling, pixel regions of a CIS device have smaller dimensions and are closer to one another. However, as the image sensing element in a pixel region decreases in size, a smaller number of incident photons reaches the image sensing element, hence, a QE of the pixel region decreases, which hinders performance of the CIS device. In addition, forming a high aspect ratio BDTI structure in the scaled CIS device is challenging, and the need of the BDTI structure further limits available spaces for the image sensing elements to remain a sufficient size.

In view of the above, to accommodate shrinkage of CIS devices, various embodiments of the present disclosure relate to a BDTI structure and corresponding method that reduces a lateral dimension of the BDTI structure. In some embodiments, the BDTI structure comprises an isolation filler structure surrounded by an isolation epitaxial bi-layer. A first isolation epitaxial layer of the isolation epitaxial bi-layer sets an outermost sidewall of the BDTI structure and has a first doping type. A second isolation epitaxial layer of the isolation epitaxial bi-layer is arranged on the first isolation epitaxial layer and along an outer surface of the isolation filler structure. The second isolation epitaxial layer has a second doping type different than the first doping type. For example, the first isolation epitaxial layer comprises n-type silicon, whereas the second isolation epitaxial layer comprises p-type silicon.

Since the first isolation epitaxial layer is a same doping type as the image sensing element, including the first isolation epitaxial layer as a part of the BDTI structure increases the effective size of the image sensing element, hence increasing the QE of the pixel region. The second isolation epitaxial layer may serve as a passivation layer for defects and may also facilitate depletion of the image sensing element during operation. This allows an amount of charges that can be stored within the pixel region without the pixel region becoming saturated, which may be referred to as a full well capacity of the pixel region, to be tuned based on a dopant concentration of the first isolation epitaxial layer.

FIG. 1 illustrates a cross-sectional view of an image sensor 100 having image sensing elements 104 separated by a BDTI structure 112 with an isolation epitaxial bi-layer 107. In some embodiments, the image sensor 100 comprises an image sensing die 118, which comprises an array deep well 101 disposed over a substrate 103. The image sensing die 118 has a frontside 122 and a backside 124 and comprises image sensing elements 104, such as a first image sensing element 104a and a second image sensing element 104b. The BDTI structure 112 separates the array deep well 101 into a plurality of pixel regions that may be arranged in an array comprising rows and/or columns, such as pixel regions 102a, 102b shown in FIG. 1. In the pixel regions 102a, 102b, the image sensing elements 104 are configured to convert incident radiation 120 (e.g., photons) into an electric signal. In some embodiments, the array deep well 101 and the image sensing elements 104 have a first doping type (e.g., n-type doping by dopants such as phosphorus, arsenic, antimony, etc.).

In some embodiments, the BDTI structure 112 extends from the backside 124 of the image sensing die 118 into the image sensing element 104. The BDTI structure 112 may comprise the isolation epitaxial bi-layer 107, a high-k dielectric layer 109, and an isolation filler structure 110. The isolation epitaxial bi-layer 107 lines a sidewall surface of a deep trench of the array deep well 101, the high-k dielectric layer 109 lines a sidewall surface of the isolation epitaxial bi-layer 107, and the isolation filler structure 110 fills a remaining space of the deep trench between inner sidewalls of the high-k dielectric layer 109. In some embodiments, the deep trench may refer to a trench that extends at least halfway into the array deep well 101. The isolation epitaxial bi-layer 107 comprises a first isolation epitaxial layer 106 setting an outermost sidewall of the BDTI structure 112 and having the first doping type and a second isolation epitaxial layer 108 arranged over the first isolation epitaxial layer 106 and having a second doping type different than the first doping type (e.g., p-type doping by dopants such as boron, aluminum, gallium, etc.). The isolation epitaxial bi-layer 107, the high-k dielectric layer 109, and the isolation filler structure 110 may extend laterally along the backside 124 of the image sensing die 118 overlying the image sensing elements 104. In alternative embodiments, the BDTI structure 112 is absent of a high-k dielectric layer, and the second isolation epitaxial layer 108 is in direct contact with the isolation filler structure 110.

By including the first isolation epitaxial layer as a part of the BDTI structure 112, the effective size of the image sensing element 104 is enlarged since the first isolation epitaxial layer 106 is a same doping type as the image sensing element 104, and a lateral dimension of the isolation structure is correspondingly reduced. Thereby, the amount of incident radiation 120 that contributes to an electric signal generated by the image sensing element 104 is increased, and QE of the pixel regions 102a, 102b is improved.

Additionally, since the second isolation epitaxial layer 108 is an opposite doping type as the first isolation epitaxial layer 106 and the image sensing element 104, the second isolation epitaxial layer 108 may serve as a passivation layer for defects and may facilitate depletion of the image sensing element 104 during operation, such that full well capacity is improved. In some embodiments, a full well capacity of the pixel regions 102a, 102b may be tuned based on a dopant concentration of the first isolation epitaxial layer 106.

In some embodiments, a plurality of color filters 114 are arranged over the backside 124 of the image sensing die 118. The plurality of color filters 114 are respectively configured to transmit specific wavelengths of incident radiation 120. For example, a first color filter (e.g., a red color filter) may transmit light having wavelengths within a first range, while a second color filter may transmit light having wavelengths within a second range different than the first range. In some embodiments, the plurality of color filters 114 may be arranged within a grid structure overlying the image sensing die 118.

In some embodiments, a plurality of micro-lenses 116 is arranged over the plurality of color filters 114. Respective micro-lenses 116 are aligned laterally with the color filters 114 and overlie the pixel regions 102a, 102b. In some embodiments, the plurality of micro-lenses 116 have a substantially flat bottom surface abutting the plurality of color filters 114 and a curved upper surface. The curved upper surface is configured to focus the incident radiation 120 (e.g., light towards the underlying pixel regions 102a, 102b). During operation of the image sensor 100, the incident radiation 120 is focused by the micro-lenses 116 to the underlying pixel regions 102a, 102b. When incident radiation of sufficient energy strikes the image sensing element 104, it generates an electron-hole pair that produces a photocurrent. Notably, though the micro-lenses 116 are shown as fixing onto the image sensor 100 in FIG. 1, it is appreciated that the image sensor 100 may not include micro-lenses, and the micro-lenses may be attached to the image sensor 100 later in a separate manufacture activity.

In some embodiments, the substrate 103 may be or comprise, for example crystalline silicon or some other suitable semiconductor material(s). In some embodiments, the image sensing elements 104 may, for example, be or comprise a photodiode, an avalanche photodiode, a single-photon avalanche diode, some other suitable photodetector, or the like. In some embodiments, the isolation filler structure 110 comprises silicon dioxide, silicon nitride, or some other suitable dielectric material(s). In some embodiments, the high-k dielectric layer 109 may be or comprise, for example, aluminum oxide ($Al_2O_3$), hafnium oxide ($HfO_2$), hafnium silicon oxide (HfSiO), hafnium aluminum oxide (HfAlO), tantalum oxide ($Ta_2O_5$), or hafnium tantalum oxide (HfTaO), or some other suitable high-k dielectric material(s). Although the BDTI structure 112 is illustrated in FIG. 1 as extending partially into the array deep well 101, it will be appreciated that in some alternative embodiments (not shown), the BDTI structure 112 may alternatively extend completely through the array deep well 101. Although the image sensor 100 illustrated in FIG. 1 is backside illuminated (BSI), it will be appreciated that in some alternative embodiments (not shown), the image sensor 100 may alternatively be frontside illuminated (FSI).

Figure 2A:
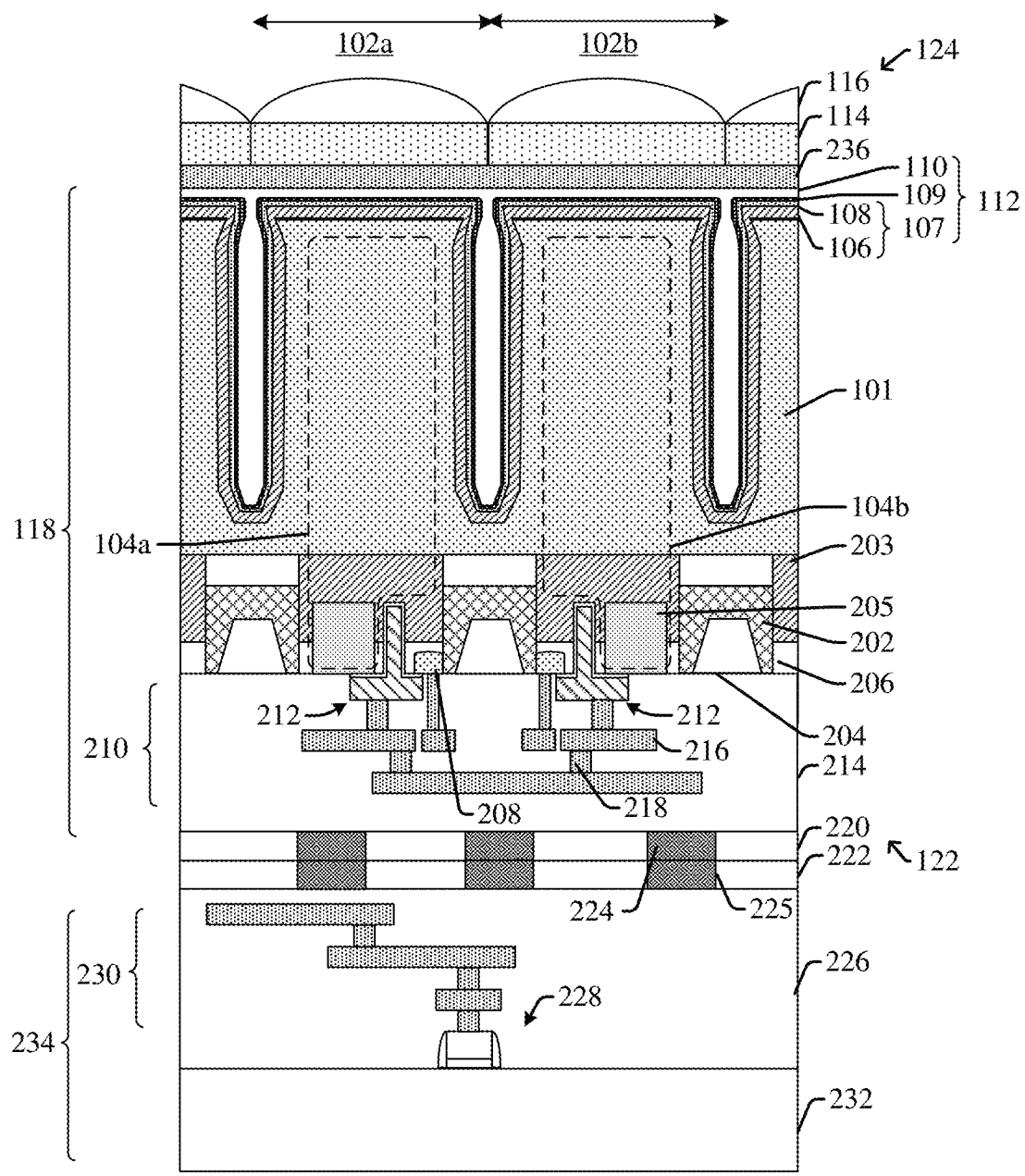
FIG. 2A illustrates a cross-sectional view of some embodiments of an integrated chip comprising an image sensing die and a logic die bonded together where the image sensing die has an image sensing element surrounded by a BDTI structure with an isolation epitaxial bi-layer.

FIG. 2A illustrates a cross-sectional view of some embodiments of an integrated chip 200A comprising an image sensing die 118 and a logic die 234 bonded together where the image sensing die 118 has image sensing elements 104a, 104b separated by a BDTI structure 112 with an isolation epitaxial bi-layer 107. The image sensing die 118 comprises a array deep well 101 and has a frontside 122 and a backside 124. An array deep well 101 is disposed within the image sensing die 118, and a doped semiconductor layer 206 may be disposed along a frontside of the array deep well 101. An isolation well 202, a deep photodiode region 203, and a pinned photodiode region 205 are disposed within the doped semiconductor layer 206. In some embodiments, the array deep well 101, the deep photodiode region 203, and the pinned photodiode region 205 may have a first doping type (e.g., n-type) and the isolation well 202 may have a second doping type (e.g., p-type) opposite the first doping type. Further, the doped semiconductor layer 206 may have the second doping type (e.g., p-type).

In some embodiments, a dopant concentration of the pinned photodiode region 205 is greater than that of the deep photodiode region 203, and the dopant concentration of the deep photodiode region 203 is greater than that of the array deep well 101. In some embodiments, the dopant concentration of the pinned photodiode region 205 is greater than $10^{18}$ atoms per cubic centimeter or some other suitable value. In some embodiments, the dopant concentration of the deep photodiode region 203 ranges from $5\times10^{17}$ to $10^{18}$ atoms per cubic centimeter, or some other suitable value. In some embodiments, the dopant concentration of the array deep well 101 may range from $10^{17}$ to $5\times10^{17}$ atoms per cubic centimeter.

The BDTI structure 112 comprises the isolation epitaxial bi-layer 107 and an isolation filler structure 110. The isolation epitaxial bi-layer 107 lines a sidewall surface of a deep trench of the array deep well 101, and the isolation filler structure 110 fills an inner space of the deep trench. The isolation epitaxial bi-layer 107 comprises a first isolation epitaxial layer 106 setting an outermost sidewall of the BDTI structure 112 and having the first doping type and a second isolation epitaxial layer 108 arranged over the first isolation epitaxial layer 106 and having a second doping type different than the first doping type. A bottom anti-reflective layer (BARL) 236 is disposed over the backside of the image sensing die 118. The BARL 236 is configured to reduce and/or prevent reflection of incident photons. In some embodiments, a plurality of color filters 114 is arranged over the BARL 236. In some embodiments, a plurality of micro-lenses 116 is arranged over the plurality of color filters 114.

The first isolation epitaxial layer 106 having the first doping type increases the effective size of the image sensing elements 104a, 104b and hence at least maintains the QE of the pixel regions 102a, 102b at a value at which performance is not hindered. Additionally, the second isolation epitaxial layer 108 has an opposite doping type as the first isolation epitaxial layer 106 and the image sensing elements 104a, 104b. The second isolation epitaxial layer 108 serves as a defect passivation layer and facilitates depletion of the image sensing elements 104a, 104b during operation, such that full well capacity is improved.

The isolation well 202 is disposed between and isolate adjacent pixel regions 102a, 102b, extending from a frontside of the doped semiconductor layer 206 to a position within the doped semiconductor layer 206. The isolation well 202 has sidewalls disposed along sidewalls of the doped semiconductor layer 206 and sidewalls of the deep photodiode region 203. In some embodiments, the doped semiconductor layer 206 is disposed between adjacent trenches of the BDTI structure 112. A floating diffusion well 208 extends from the frontside of the doped semiconductor layer 206 to a position within the doped semiconductor layer 206. The BDTI structure 112 extends to a location overlying the isolation well 202. Although the BDTI structure 112 is illustrated in FIG. 1 as extending partially into the array deep well 101, it will be appreciated that in some alternative embodiments (not shown), the BDTI structure 112 may alternatively extend completely through the array deep well 101.

A shallow trench isolation (STI) structure 204 may be disposed between the adjacent pixel regions 102a, 102b from the frontside of the isolation well 202 to a position within the isolation well 202. The STI structure 204 and the BDTI structure 112 may be vertically aligned. The isolation well 202 may separate the STI structure 204 from the image sensing elements 104a, 104b and/or the BDTI structure 112. The BDTI structure 112, the isolation well 202, and the STI structure 204 collectively function as isolations for the pixel regions 102a, 102b, such that crosstalk and blooming among the pixel regions 102a, 102b can be reduced. The second isolation epitaxial layer 108 of the BDTI structure 112 and the isolation well 202 also collectively facilitate depletion of the image sensing elements 104a, 104b during operation, such that full well capacity is improved.

A transfer gate 212 is arranged along the frontside 122 of the doped semiconductor layer 206. The transfer gate 212 may further extend from the frontside of the doped semiconductor layer 206 to a position within the deep photodiode region 203. During operation, the transfer gate 212 controls charge transfer from the image sensing element 104a, 104b to the floating diffusion well 208. If the charge level is sufficiently high within the floating diffusion well 208, a source follower transistor (not shown) is activated and charges are selectively output according to operation of a row select transistor (not shown) used for addressing. A reset transistor (not shown) can be used to reset the image sensing element 104a, 104b between exposure periods. A metallization stack 210 comprising a plurality of metal lines 216 and a plurality of metal interconnect vias 218 is disposed within a first inter-dielectric layer (ILD) structure 214, and is electrically coupled to the transfer gate 212 and the diffusion well 208.

The logic die 234 may comprise logic devices 228 disposed over a logic substrate 232. The logic die 234 may further comprise a metallization stack 230 disposed within a second ILD structure 226 overlying the logic devices 228. The image sensing die 118 and the logic die 234 may be bonded face to face, face to back, or back to back. As an example, FIG. 2A shows a face to face bonding structure where a pair of intermediate bonding dielectric layers 220, 222, and bonding pads 224, 225 are arranged between the image sensing die 118 and the logic die 234 and respectively bond the metallization stacks 210, 230 through a fusion or a eutectic bonding structure.

In some embodiments, the STI structure 204 may be or comprise, for example, silicon dioxide, silicon nitride, or the like. In some embodiments, the bonding pads 224, 225, the plurality of metal lines 216, the plurality of metal interconnect vias 218, and the metallization stack 230 are or comprise, for example, copper, aluminum, some other suitable metal(s), or a combination of the foregoing. In some embodiments, the first ILD structure 214 and the second ILD structure 226 may be or comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the BARL 236 may be or comprise, for example, silicon oxynitride or some other suitable anti-reflective material(s).

Figure 2B:
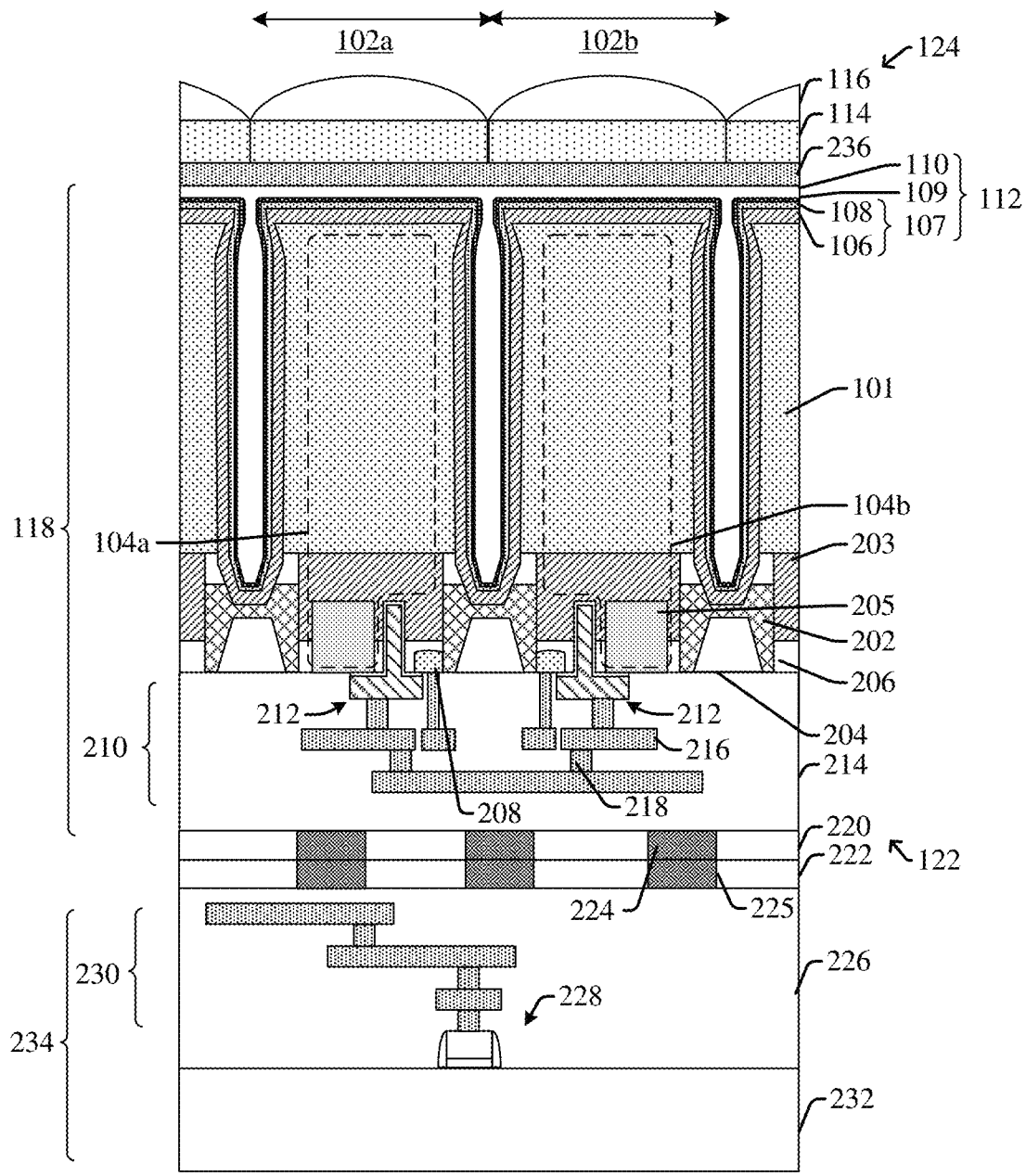
FIG. 2B illustrates a cross-sectional view of some alternative embodiments of the integrated chip of FIG. 2A in which the BDTI structure extends to a position within the isolation well.

FIG. 2B illustrates a cross-sectional view 200B of some alternative embodiments of the integrated chip of FIG. 2A in which the BDTI structure 112 extends to a position within the isolation well 202. The BDTI structure 112 extends entirely through the array deep well 101, such that the array deep wells 101 of corresponding pixel regions 102a, 102b are completely isolated from one another. The BDTI structure 112 protrudes into the isolation well 202 such that a bottom surface of the BDTI structure 112 is below a top surface of the isolation well 202. In some embodiments, the BDTI structure 112 may extend completely through the image sensing die 118 so as to achieve complete isolation.

Figure 3A:
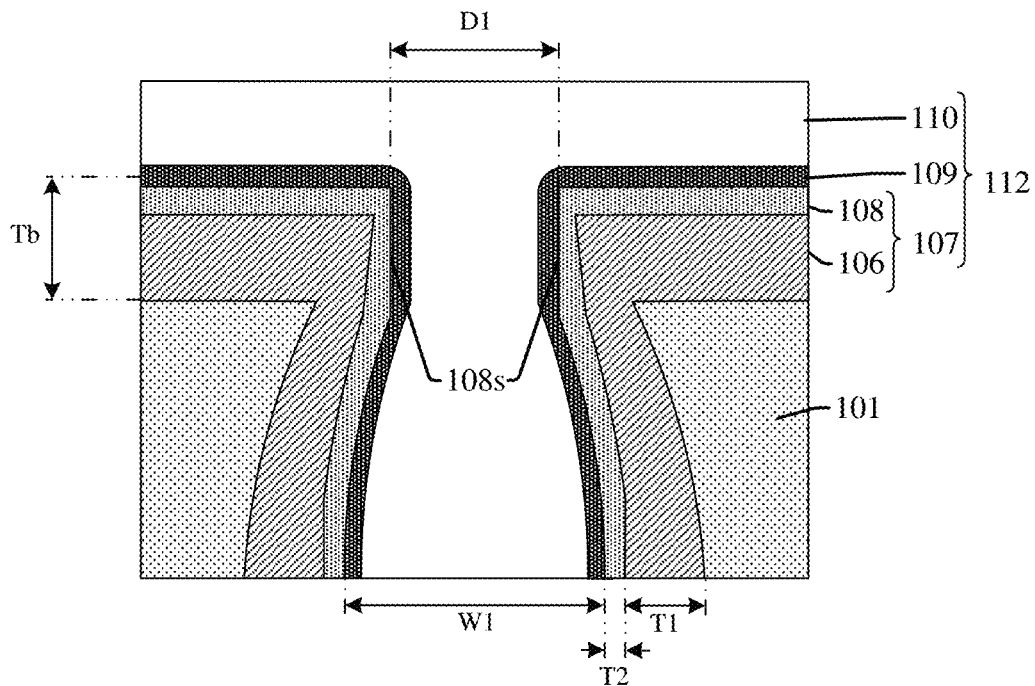
FIGS. 3A-3C illustrate cross-sectional views of some embodiments of a BDTI structure with an isolation epitaxial bi-layer.
Figure 3B:
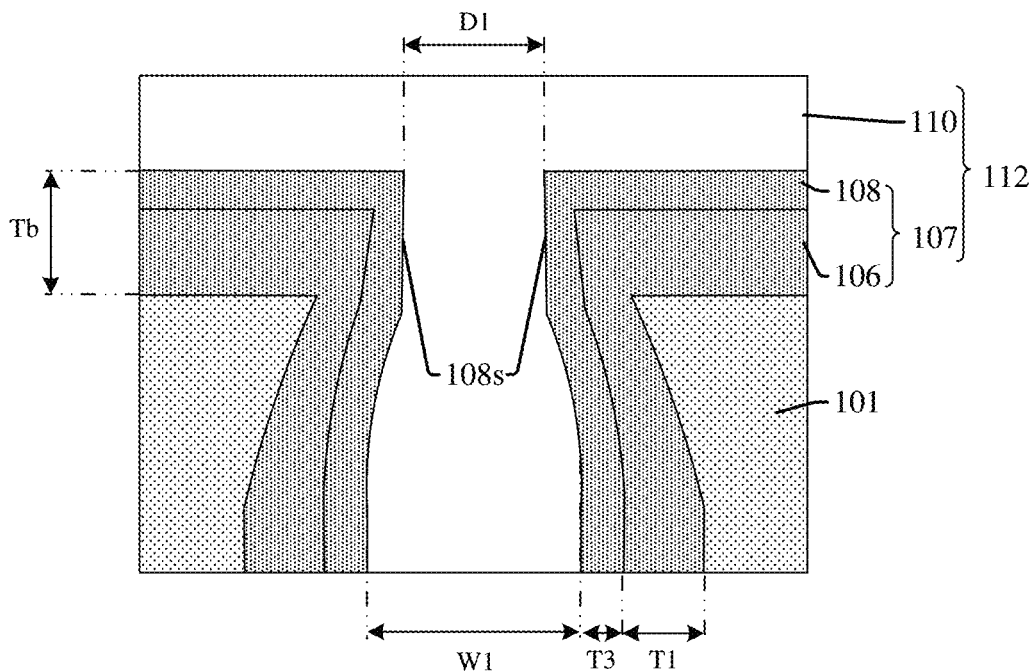
Figure 3C:
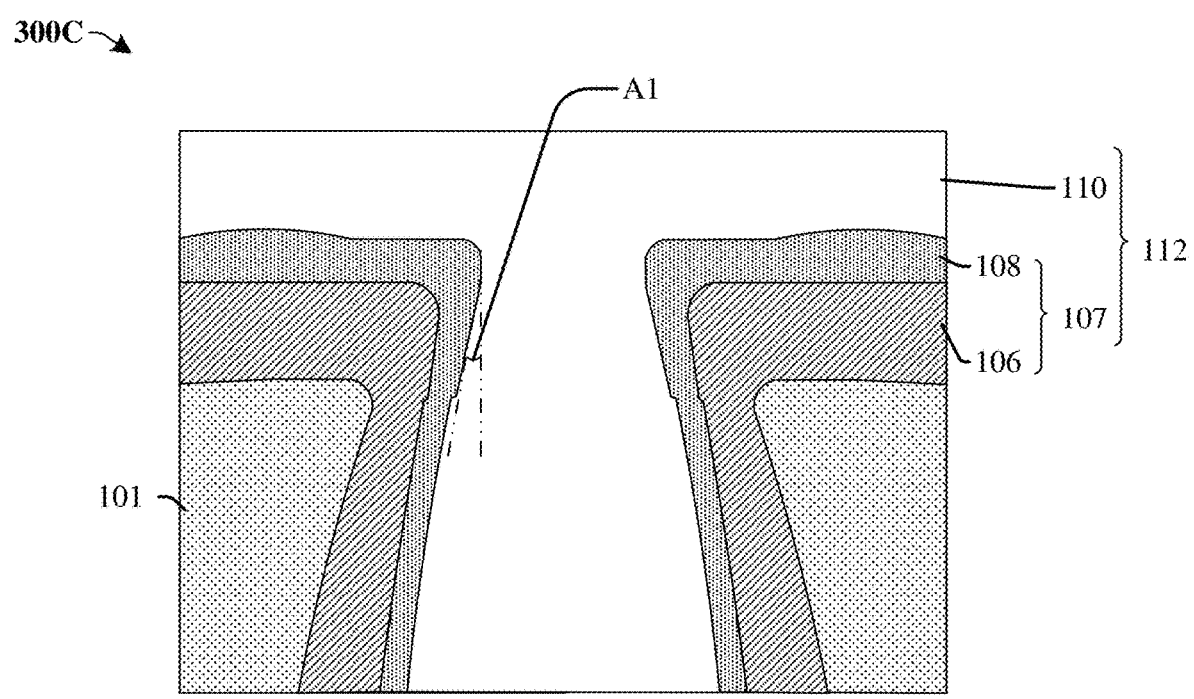

FIGS. 3A-3C illustrate cross-sectional views 300A-300C of some embodiments of a BDTI structure 112 with an isolation epitaxial bi-layer 107. In some embodiments, FIGS. 3A-3C may each correspond to a portion 130 of FIG. 1. In some embodiments, FIGS. 3A-3C may correspond to the BDTI structure 112 of FIG. 2A.

With respect to cross-sectional view 300A of FIG. 3A, the isolation filler structure 110, the high-k dielectric layer 109, the isolation epitaxial bi-layer 107, and the array deep well 101 are as described with respect to FIG. 1. An upper surface of the array deep well 101 overhangs the BDTI structure 112. The second isolation epitaxial layer 108 comprises a pair of inner sidewalls 108s. In some embodiments, the pair of inner sidewalls 108s extend vertically along a direction perpendicular to a lateral surface of the array deep well 101. In some embodiments, a distance D1 between the pair of inner sidewalls 108s is less than a maximum width W1 of the isolation filler structure 110 within the array deep well 101.

The first isolation epitaxial layer 106 has a thickness T1 along sidewalls of the array deep well 101. The second isolation epitaxial layer 108 has a thickness T2 along sidewalls of the array deep well 101. In some embodiments, the thickness T1 ranges from approximately 29 nanometers to approximately 50 nanometers, from approximately 29 nanometers to approximately 31 nanometers, from approximately 35 nanometers to approximately 45 nanometers, or some other acceptable value. In some embodiments, if the thickness T1 is too small (e.g., below 29 nanometers), the effective size of the image sensing element may be too small, hence the QE of the pixel regions may not be sufficiently maintained. In some embodiments, if the thickness T1 is too large (e.g., above 50 nanometers), the image sensing element may be unable to sufficiently deplete, impairing device performance.

In some embodiments, the thickness T2 ranges from approximately 0.1 nanometers to approximately 3 nanometers, from approximately 1 nanometer to approximately 3 nanometers, from approximately 1 nanometer to approximately 2 nanometers, or some other acceptable value. In some embodiments, if the thickness T2 is too small (e.g., below 0.1 nanometers), the second isolation epitaxial layer 108 may be unable to act as a passivation layer. In some embodiments, if the thickness T2 is too large (e.g., above 3 nanometers), the image sensing element may be unable to sufficiently deplete, negatively impacting device performance. In some embodiments, T1 is at least 10 times greater than T2, at least 8 times greater than T2, or some other suitable value.

The isolation epitaxial bi-layer 107 has a thickness Tb along a laterally extending upper surface of the array deep well 101. In some embodiments, the thickness Tb ranges from approximately 60 nanometers to approximately 106 nanometers, from approximately 60 nanometers to approximately 65 nanometers, from approximately 100 nanometers to approximately 105 nanometers, or some other acceptable value. In some embodiments, the thickness Tb may be approximately twice the sum of the thickness T1 and the thickness T2.

In some embodiments, the distance D1 between inner sidewalls 108s of the second isolation epitaxial layer 108 may range from approximately 100 nanometers to approximately 115 nanometers, from approximately 105 nanometers to approximately 110 nanometers, or some other suitable value. In some embodiments, the maximum width W1 of the isolation filler structure 110 may range from approximately 150 nanometers to approximately 170 nanometers, from approximately 160 nanometers to approximately 162 nanometers, or some other suitable value.

The distance D1 between the inner sidewalls 108s of the second isolation epitaxial layer 108 represents an effective size of the BDTI structure 112. Since the isolation epitaxial bi-layer 107 contributes to the effective size of the image sensing elements and does not contribute to the effective size of the BDTI structure 112, a lower distance D1 may correspond to a greater effective size of the image sensing elements, and thus a greater QE of pixel regions within the image sensor.

With respect to cross-sectional view 300B of FIG. 3B, some alternative embodiments of the BDTI structure 112 of FIG. 3A are illustrated. The BDTI structure 112 is as described with respect to FIG. 3A, but the high-k dielectric layer 109 is omitted. Further, the second isolation epitaxial layer 108 has a thickness T3 along sidewalls of the array deep well 101 that is greater than the thickness T2 to passivate defects and sufficiently isolate in lieu of a high-k dielectric layer.

In some embodiments, the thickness T3 ranges from approximately 5 nanometers to approximately 10 nanometers, from approximately 7 nanometers to approximately 10 nanometers, from approximately 6 nanometers to approximately 9 nanometers, or some other acceptable value. In some embodiments, if the thickness T3 is too small (e.g., below 5 nanometers), the second isolation epitaxial layer 108 may be unable to passivate defects. In some embodiments, if the thickness T2 is too large (e.g., above 10 nanometers), the image sensing element may be unable to sufficiently deplete, negatively impacting device performance. In some embodiments, T1 is at least 3 times greater than T3, at least 5 times greater than T3, or some other suitable value.

With respect to cross-sectional view 300C of FIG. 3C, some alternative embodiments of the BDTI structure 112 of FIG. 3B are illustrated. The BDTI structure 112 is as described with respect to FIG. 3B. The second isolation epitaxial layer 108 comprises a pair of inner sidewalls. The pair of inner sidewalls comprise a portion that extend at an angle A1 of other than zero degrees with respect to a vertical line perpendicular to a lateral plane of the array deep well 101. In some embodiments, the pair of inner sidewalls comprise a portion that extends vertically. In some embodiments, the angle A1 may range from approximately 1 degree to approximately 15 degrees, approximately 8 degrees to approximately 15 degrees, or some other suitable value.

Figure 4:
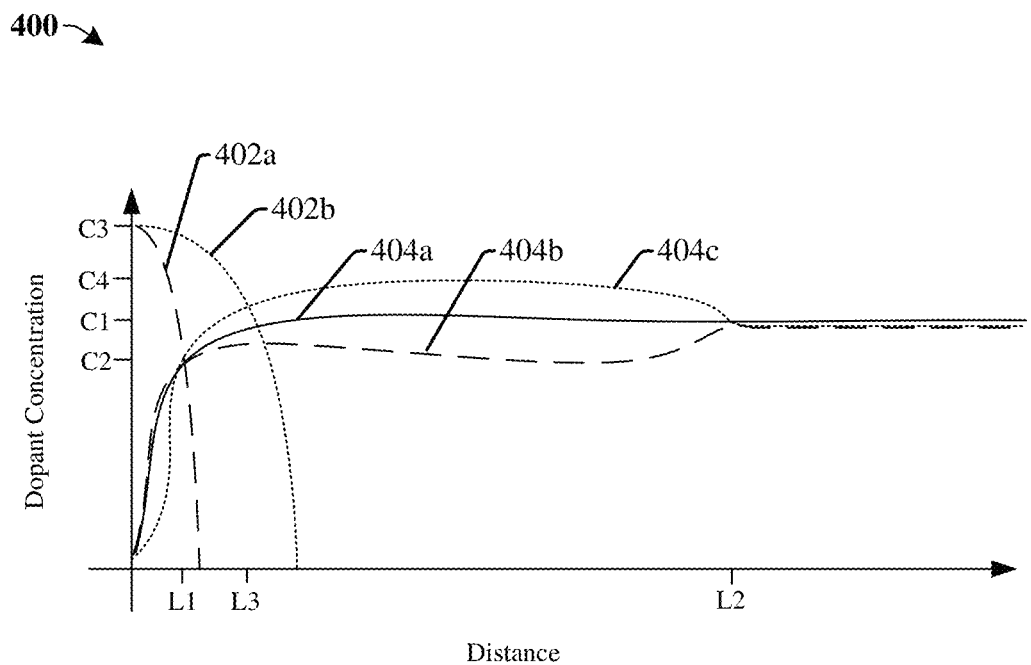
FIG. 4 illustrates a graphical representation of some embodiments of a dopant profile of an image sensor having an image sensing element surrounded by a BDTI structure with an isolation epitaxial bi-layer

FIG. 4 illustrates a graphical representation 400 of some embodiments of a dopant profile of an image sensor having an image sensing element surrounded by a BDTI structure with an isolation epitaxial bi-layer. In some embodiments, the isolation epitaxial bi-layer may be the isolation epitaxial bi-layer 107 as described in FIG. 1. In some embodiments, the graph plots a dopant concentration of the individual layers of the isolation epitaxial bi-layer against a distance from the isolation filler structure.

Lines 402a-402b represent a dopant profile of the p-doped second isolation epitaxial layer of the isolation epitaxial bi-layer. Lines 404a-404c represent a dopant profile of the n-doped first isolation epitaxial layer of the isolation epitaxial bi-layer. In some first embodiments, line 404a may correspond to an isolation epitaxial bi-layer in which the first isolation epitaxial layer has a same dopant concentration as the image sensing element. Past a sufficient distance, the dopant concentration of the base line 402 remains generally constant at a first concentration C1.

In some second embodiments, the line 402a and the line 404b meet at point representing a first pn junction. The first pn junction is at a first distance L1 from the isolation filler structure. In some embodiments, the first distance L1 may correspond to the thickness T1 of the second isolation epitaxial layer as described in FIG. 3. From the first distance L1 to a second distance L2, the dopant concentration of the line 404b remains generally constant at a second concentration C2. Past the second distance L2, the dopant concentration of the line 404b remains generally constant at the first concentration C1. The second concentration C2 is less than the first concentration C1, such that at the second distance L2, the dopant concentration of the line 404b increases. When the dopant concentration of the first isolation epitaxial layer is less than that of the image sensing element, a dopant concentration of the image sensing element, which includes the first isolation epitaxial layer, is smaller than a dopant concentration of an image sensing element associated with line 404a. Thus, a full well capacity of the pixel region is also smaller than a full well capacity associated with line 404a. However, the image sensor also has less lag than an image sensor associated with line 404a, as a smaller image sensing element means the photocurrent is easier to retrieve. In some embodiments, the second distance L2 corresponds to a total thickness of the isolation epitaxial bi-layer, such that a distance greater than the second distance L2 extends into the image sensing element. In some embodiments, the second distance L2 may correspond to the thickness Tb of the isolation epitaxial bi-layer as described in FIGS. 3A-3B. In some embodiments, the second distance L2 may correspond to the sum of the thickness T1 of the first isolation epitaxial layer as described in FIG. 3 and the thickness T2 of the second isolation epitaxial layer as described in FIGS. 3A-3B. The line 402a has a third concentration C3 at a distance less than the first distance L1.

In some third embodiments, the line 402b and the line 404c meet at point representing a second pn junction. The second pn junction is at a third distance L3 from the isolation filler structure. In some embodiments, the third distance L3 may correspond to an interface residing within the first isolation epitaxial layer, such that the third distance L3 is greater than the thickness T1 of the second isolation epitaxial layer as described in FIGS. 3A-3B. In some embodiments, the second pn junction is within an interface within the first isolation epitaxial layer. From the third distance L3 to the second distance L2, the dopant concentration of the line 404c remains generally constant at a fourth concentration C4. Past the second distance L2, the dopant concentration of the second N line 406b remains generally constant at the first concentration C1. The fourth concentration C4 is greater than the first concentration C1, such that at the second distance L2, the dopant concentration of the line 404c decreases. When the dopant concentration of the first isolation epitaxial layer is greater than that of the image sensing element, a dopant concentration of the image sensing element, which includes the first isolation epitaxial layer, is greater than a dopant concentration of an image sensing element associated with line 404a. Thus, a full well capacity of the pixel region is also greater than the full well capacity associated with line 404a. However, the image sensor also has more lag than the image sensor associated with line 404a, as a larger image sensing element means the photocurrent is more difficult to retrieve. The line 402b may have the third concentration C3 at a distance less than the third distance L3. In some embodiments, the third distance L3 may range from 5 nanometers to 10 nanometers, 6 nanometers to 9 nanometers, or some other suitable value.

In some embodiments, the first concentration C1 may be approximately $5 \times 10^{17}$ atoms per cubic centimeter or some other suitable value. In some embodiments, the second concentration C2 may be approximately $3 \times 10^{17}$ atoms per cubic centimeter, or some other suitable value less than the first concentration C1. In some embodiments, the fourth concentration C4 may be approximately $7 \times 10^{17}$ atoms per cubic centimeter, or some other suitable value greater than the first concentration C1. In some embodiments, the third concentration C3 may be approximately $3 \times 10^{19}$ atoms per cubic centimeter or some other suitable value.

FIGS. 5-22 illustrate a series of cross-sectional views 500-2100 showing some embodiments of a method of forming an integrated chip comprising an image sensing die and a logic die bonded together where the image sensing die has image sensing elements separated by a BDTI structure with an isolation epitaxial bi-layer. Though doping types are provided for varies doped regions as an example, it is appreciated that reversed doping types can be used for these doped regions to realize a reversed image sensor device structure. Further, though FIGS. 5-21 are described in relation to a method, it will be appreciated that the structures disclosed in FIGS. 5-22 are not limited to such a method, but instead may stand alone as structures independent of the method.

Figure 5:
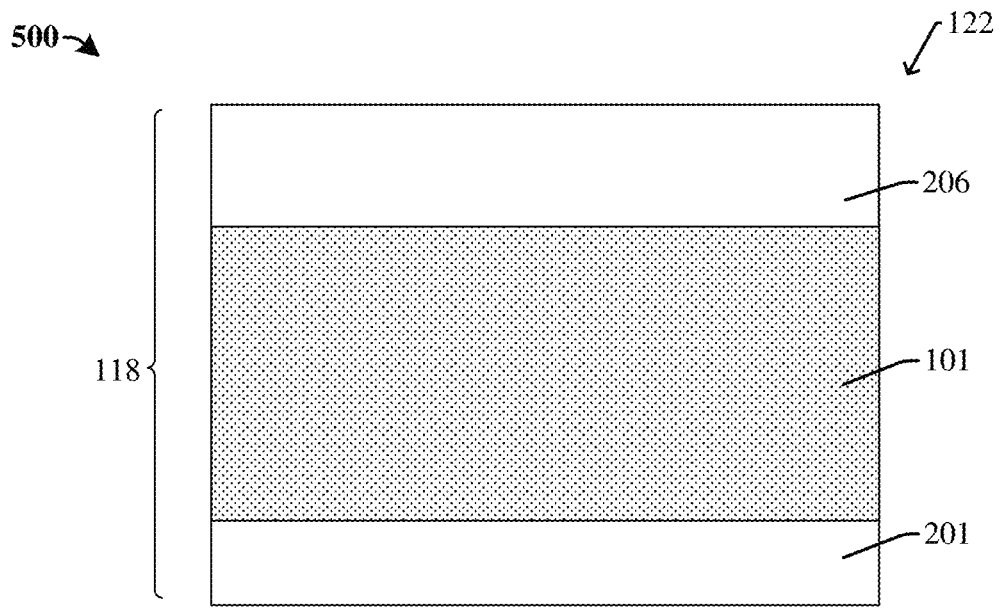
FIGS. 5-22 illustrate a series of cross-sectional views showing some embodiments of a method of forming an integrated chip comprising an image sensing die and a logic die bonded together where the image sensing die has an image sensing element surrounded by a BDTI structure with an isolation epitaxial bi-layer.

As illustrated by the cross-sectional view 500 of FIG. 5, a array deep well 101 is formed on or within a substrate 201 of an image sensing die 118. In some embodiments, the substrate 201 underlies the array deep well 101. In some embodiments, the array deep well 101 is formed of a first doping type by a doping process. In some embodiments, the doping process may be or comprise, for example, ion implantation or some other suitable doping process. In some embodiments, an epitaxial process of a second doping type opposite the first doping type (e.g., p-type) may be performed to form a doped semiconductor layer 206 on the substrate 201. In some embodiments, the doped semiconductor layer 206 may alternatively be pre-doped with the second doping type and formed over the array deep well 101 by, for example, a deposition process such as physical vapor deposition, chemical vapor deposition, or the like. In some embodiments, an overlying substrate (not shown) may alternatively be formed over the array deep well 101 by, for example, a deposition process such as physical vapor deposition, chemical vapor deposition, or the like, and an implantation process may be performed on the overlying substrate to form the doped semiconductor layer 206.

Figure 6:
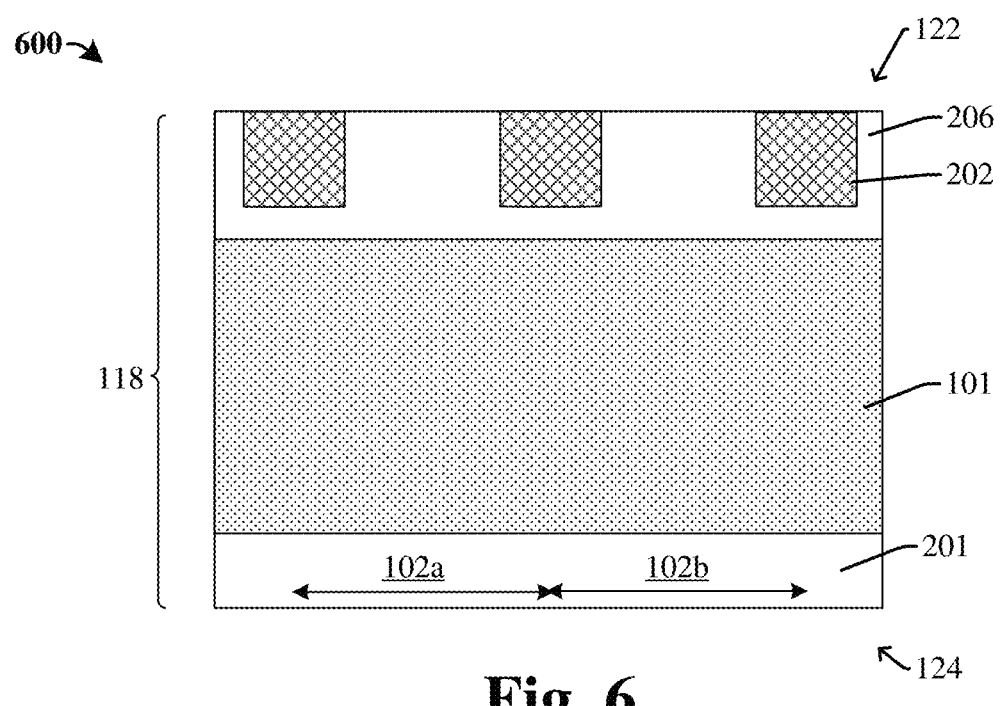

As illustrated by the cross-sectional view 600 of FIG. 6, in some embodiments, a plurality of isolation wells 202 having the second doping type are formed into the doped semiconductor layer 206 between adjacent pixel regions 102a, 102b from a frontside of the doped semiconductor layer 206 to a position within the doped semiconductor layer 206 or the array deep well 101. In some embodiments, the plurality of isolation wells 202 may be formed by, for example, a doping process. In some embodiments, the doping process may comprise implanting p-type dopant species into the substrate 201 between adjacent pixel regions 102a, 102b. In some embodiments, the doped semiconductor layer 206 may be selectively implanted according to patterned masking layers (not shown) comprising photoresist.

Figure 7:
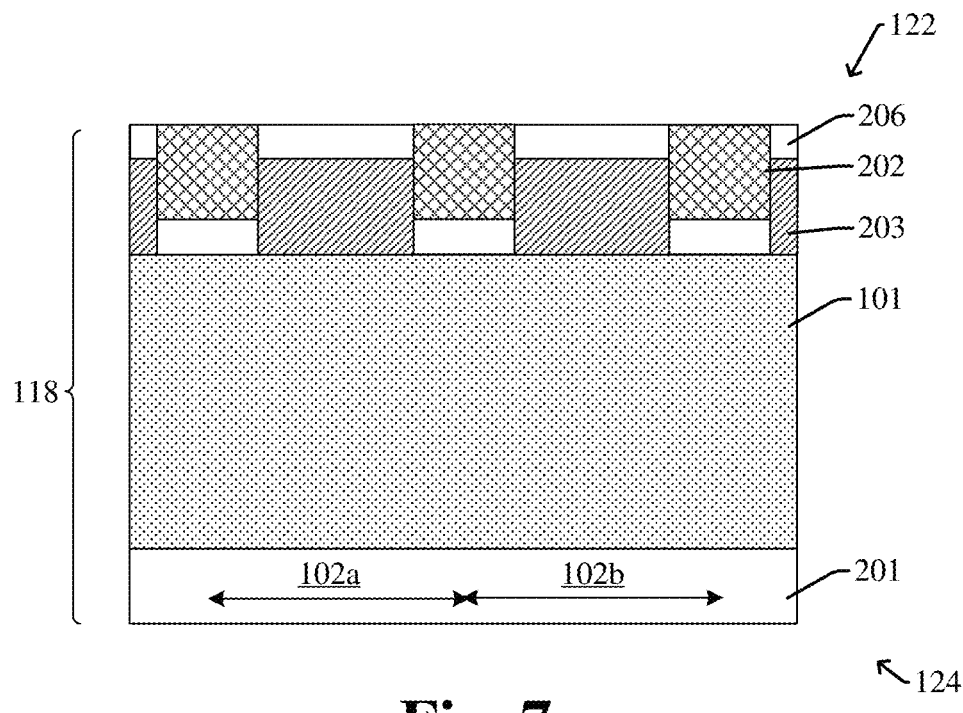

As illustrated by the cross-sectional view 700 of FIG. 7, in some embodiments, a plurality of deep photodiode regions 203 having the first doping type is formed into the doped semiconductor layer 206 by a doping process. In some embodiments, the plurality of deep photodiode regions 203 are separated from one another by the plurality of isolation wells 202. In some embodiments, the doping process may be or comprise, for example, ion implantation, an n-type epitaxial process, or some other suitable doping process. In some embodiments, the doped semiconductor layer 206 may be selectively implanted according to patterned masking layers (not shown) comprising photoresist. In some embodiments, the plurality of deep photodiode regions 203 separates the doped semiconductor layer 206 from the array deep well 101. In some embodiments, the plurality of deep photodiode regions 203 has a greater dopant concentration than the array deep well 101.

Figure 8:
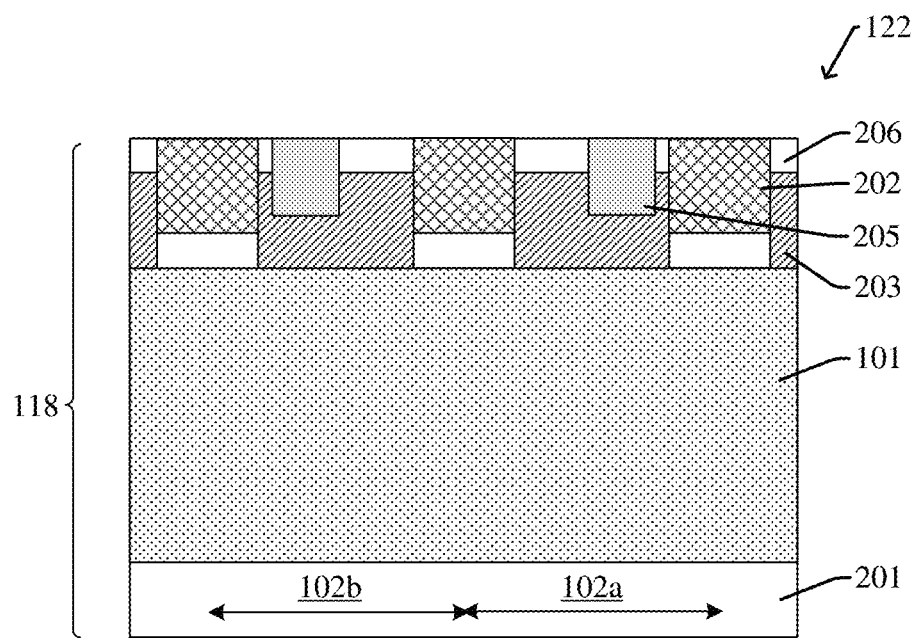

As illustrated by the cross-sectional view 800 of FIG. 8, in some embodiments, a plurality of pinned photodiode regions 205 having the first doping type is formed into the doped semiconductor layer 206 between the plurality of isolation wells 202 from the frontside 122 of the image sensing die 118 to a position within the plurality of deep photodiode regions 203. In some embodiments, the plurality of pinned photodiode regions 205 may be formed by, for example, a doping process. In some embodiments, the doping process may comprise implanting n-type dopant species into the doped semiconductor layer 206. In some embodiments, the doped semiconductor layer 206 may be selectively implanted according to patterned masking layers (not shown) comprising photoresist.

Figure 9:
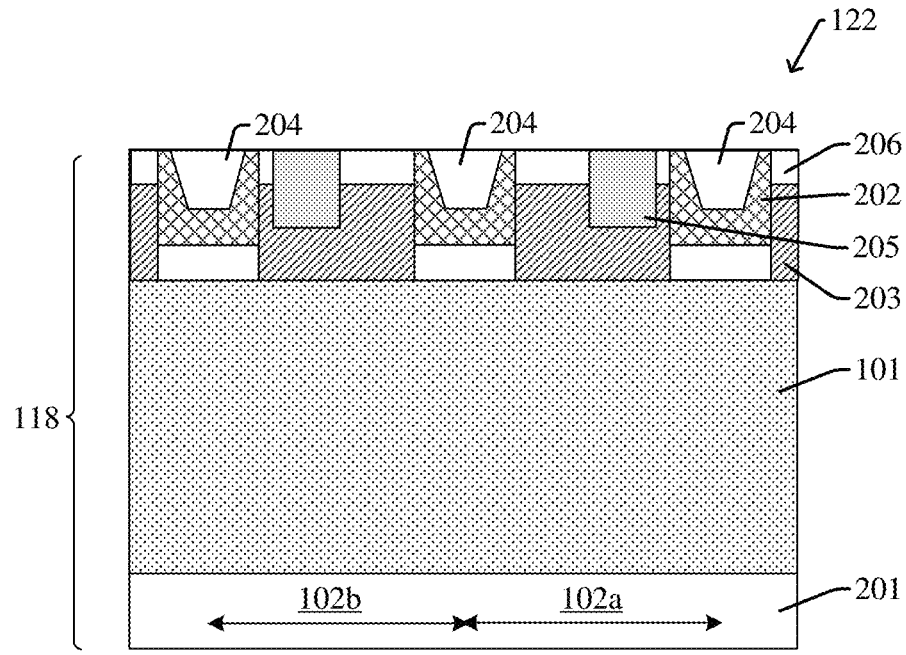

As illustrated by the cross-sectional view 900 of FIG. 9, a plurality of STI structures 204 is formed image sensing die 118 from the frontside 122 image sensing die 118 to a position within the plurality of isolation wells 202. The plurality of STI structures 204 may be formed by selectively etching the frontside 122 of the image sensing die 118 to form shallow-trenches and subsequently forming a dielectric material (e.g., an oxide) within the shallow-trenches. In some embodiments, the STI structures 204 may respectively be centrally aligned with the plurality of isolation wells 202.

Figure 10:
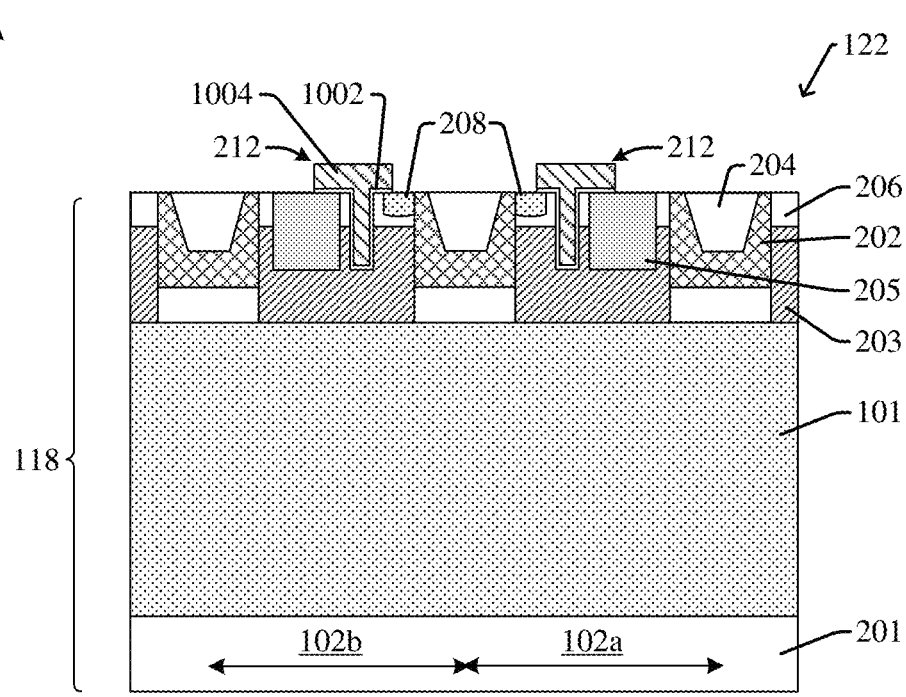

As illustrated by the cross-sectional view 1000 of FIG. 10, in some embodiments, a transfer gate 212 is formed over the frontside 122 of the image sensing die 118. Further, a floating diffusion well 208 is formed within the doped semiconductor layer 206. The transfer gate 212 extends from the frontside 122 of the image sensing die 118 to a position within the plurality of deep photodiode regions 203. The transfer gate 212 may be formed by etching a trench into the image sensing die 118 and depositing a gate dielectric layer and a gate electrode layer into the trench and over the image sensing die 118. The gate dielectric layer and the gate electrode layer are subsequently patterned to form a gate dielectric 1002 and a gate electrode 1004. The floating diffusion well 208 may be formed by, for example, a doping process. In some embodiments, the doping process may be or comprise an ion implantation process performed within the frontside 122 of the image sensing die 118, or some other suitable process. In some embodiments, the floating diffusion well 208 is formed between the transfer gate 212 and one of the pluralities of isolation wells 202.

Figure 11:
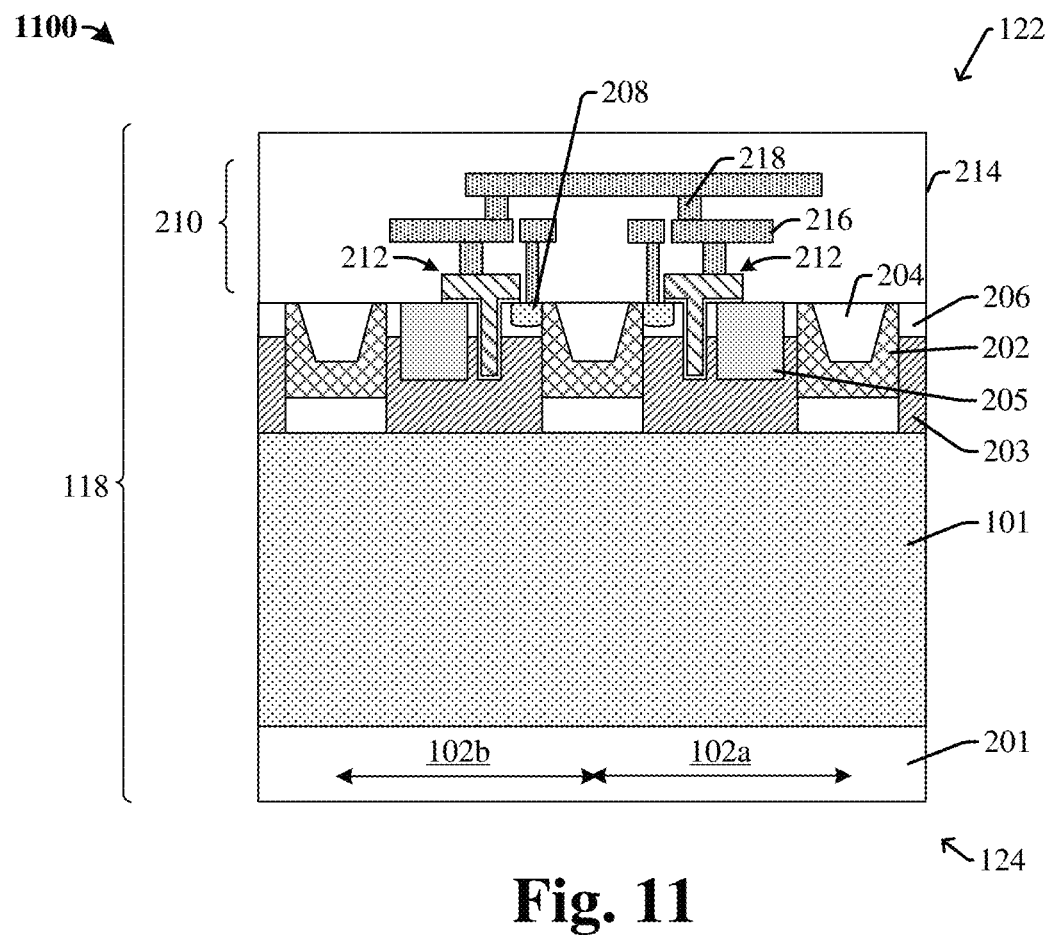

As illustrated by cross-sectional view 1100 of FIG. 11, in some embodiments, a metallization stack 210 may be formed on the frontside of the doped semiconductor layer 206. In some embodiments, the metallization stack 210 may be formed by forming a first ILD structure 214, which comprises one or more layers of ILD material, on the frontside 122 of the image sensing die 118. The first ILD structure 214 is subsequently etched to form via holes and/or metal trenches. The via holes and/or metal trenches are then filled with a conductive material to form the plurality of metal interconnect vias 218 and metal lines 216. In some embodiments, the first ILD structure 214 may be deposited by a physical vapor deposition technique (e.g., PVD, CVD, etc.). The plurality of metal interconnect layers may be formed using a deposition process and/or a plating process (e.g., electroplating, electro-less plating, etc.).

Figure 12:
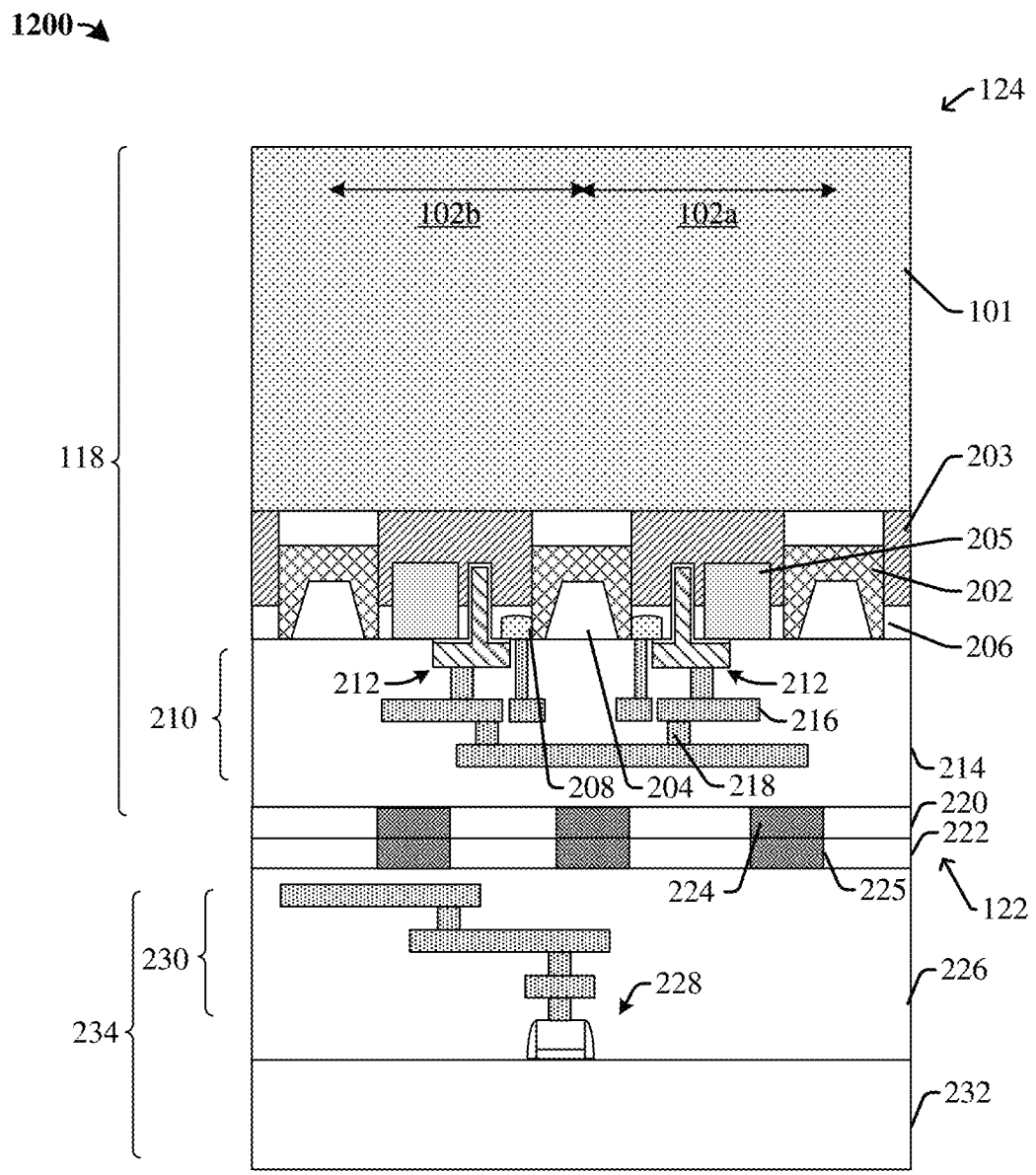

As illustrated by cross-sectional view 1200 of FIG. 12, in some embodiments, the image sensing die 118 can then be bonded to another die. For example, the image sensing die 118 can be bonded to a logic die 234 prepared to have logic devices 228. The image sensing die 118 and the logic die 234 may be bonded face to face, face to back, or back to back. For example, the bonding process may use a pair of intermediate bonding dielectric layers 220, 222, and bonding pads 224, 225 to bond the metallization stacks 210, 230 of the image sensing die 118 and the logic die 234. The bonding process may comprise a fusion or a eutectic bonding process. The bonding process may also comprise a hybrid bonding process including metal to metal bonding of the bonding pads 224, 225, and dielectric to dielectric bonding of the intermediate bonding dielectric layers 220, 222. An anneal process may follow the hybrid bonding process, and may be performed at a temperature range between about 250° C. to about 450° for a time in a range of about 0.5 hour to about 4 hours, for example.

In some embodiments, the image sensing die 118 is thinned to remove the substrate 201. The image sensing die 118 may be thinned by mechanical grinding the backside 124 of the image sensing die 118. As an example, the image sensing die 118 can be firstly grinded, then, an aggressive wet etch can be applied to further thin the image sensing die 118. An example of the etchant may include hydrogen fluoride/nitric/acetic acid (HNA). A chemical mechanical process and a tetramethylammonium hydroxide (TMAH)) wet etching may then follow to further thin the substrate 201 so radiation can pass through the backside 124 of the image sensing die 118.

Figure 13:
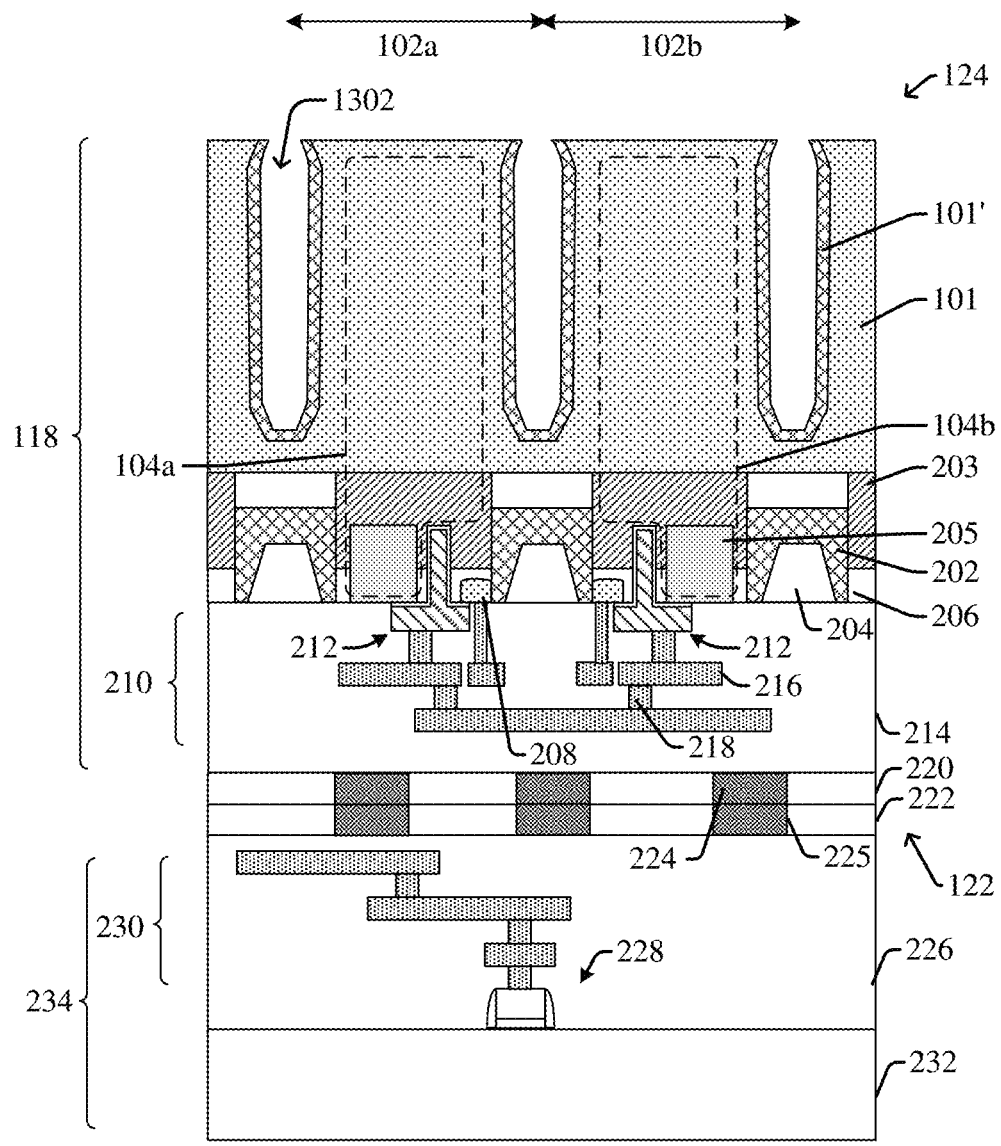

As illustrated in cross-sectional view 1300 of FIG. 13, in some embodiments, the image sensing die 118 is selectively etched to form deep trenches 1302 within the backside 124 of the image sensing die 118 laterally separating a plurality of image sensing elements 104 from one another. In some embodiments, the deep trenches 1302 may refer to trenches that extend at least halfway through the array deep well 101. In some embodiments, the image sensing die 118 may be etched by forming a masking layer onto the backside 124 of the image sensing die 118. The image sensing die 118 is then exposed to an etchant in regions not covered by the masking layer. The etchant etches the image sensing die 118 to form the deep trenches 1302 extending into the image sensing die 118. In some alternative embodiments, the deep trenches 1302 extend through the image sensing die 118 and may reach on the first ILD structure 214, such that a complete isolation is achieved. In some alternative embodiments, the deep trenches 1302 extend through the image sensing die 118 and may protrude into the plurality of isolation wells 202, such that a complete isolation between the array deep wells 101 of corresponding pixel regions 102a, 102b is achieved. In various embodiments, the masking layer may comprise photoresist or a nitride (e.g., SiN) patterned using a photolithography process. The masking layer may also comprise atomic layer deposition (ALD) or plasma enhanced CVD oxide layer. In various embodiments, the etchant may comprise a dry etchant have an etching chemistry comprising a fluorine species (e.g., $CF_4$, $CHF_3$, $C_4F_8$, etc.) or a wet etchant (e.g., hydroflouric acid (HF) or tetramethylammonium hydroxide (TMAH)). A lateral dimension of the deep trenches 1302 may have a range between approximately 95 nanometers and approximately 105 nanometers. A portion of the array deep well 101 forms a damaged portion 101' exposed to the deep trench 1302 as a damage result of the etching process and may include native oxide and other unwanted impurity layers.

Figure 14:
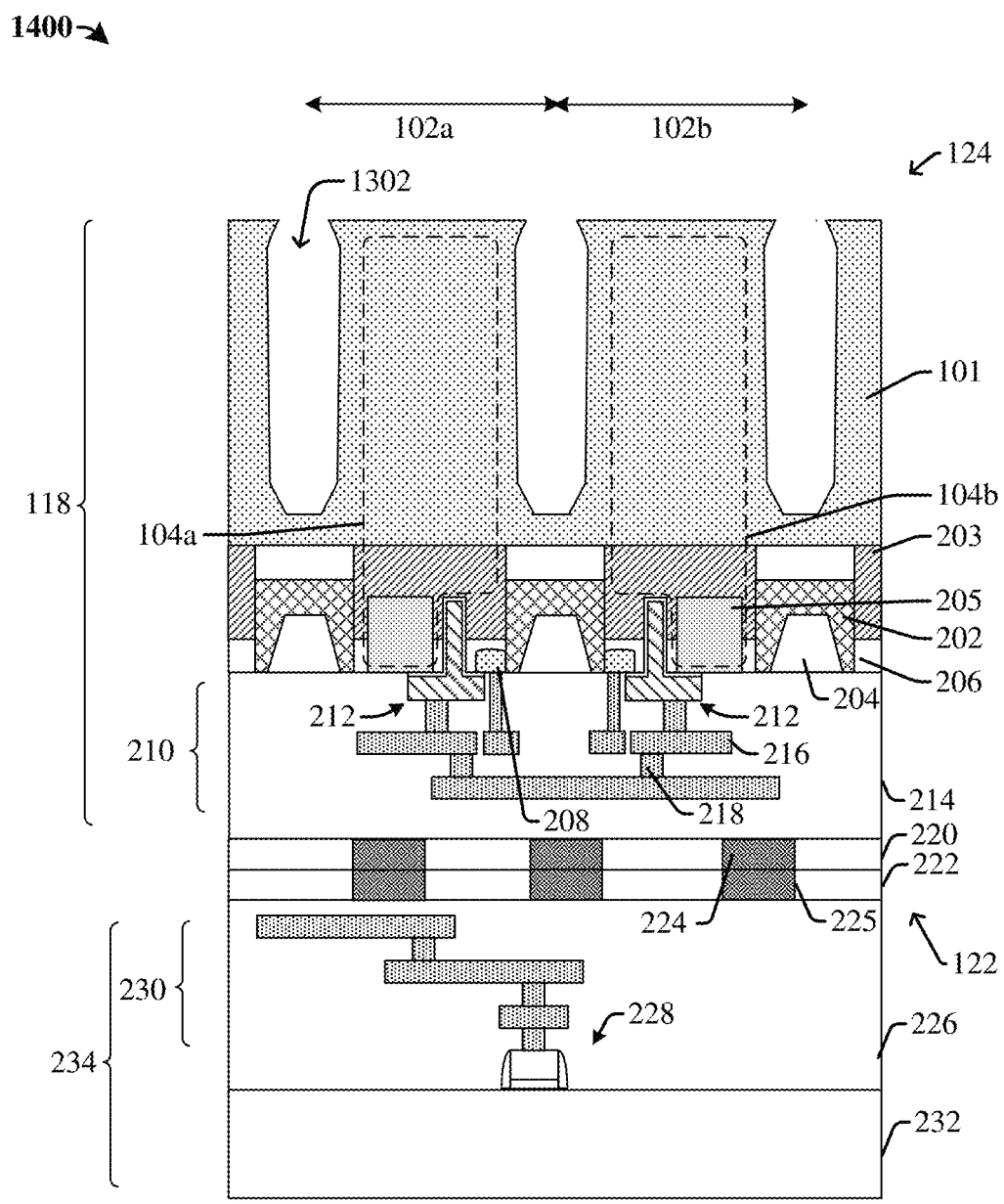

As illustrated by cross-sectional view 1400 of FIG. 14, in some embodiments, a removal process is performed on the deep trenches 1302 to remove the damaged portion 101' and smoothen sidewall surfaces of the deep trenches 1302. The removal process may comprise, for example, a wet etching process and/or a dry etching process to enlarge the lateral dimension of the deep trenches 1302. In various embodiments, the wet etching process comprises exposing the sidewalls of the deep trenches 1302 to a wet etchant (e.g., tetramethylammonium hydroxide (TMAH)). In various embodiments, the dry etching process comprises exposing the sidewalls of the deep trenches 1302 to a dry etchant (e.g., chlorine gas ($H_2$), gaseous hydrochloric acid (HCl), or germane gas ($GeH_4$)). In some embodiments, the dry etching process is performed in-situ, meaning that a chamber used for subsequent formation processes (e.g., low pressure chemical vapor deposition epitaxial tool) is also used for the dry etching process. In some embodiments, the removal process increases the lateral dimension of the deep trenches 1302 by a range between approximately 20 nanometers and approximately 30 nanometers per side, between approximately 25 nanometers and approximately 30 nanometers per side, or some other suitable value.

Figure 15:
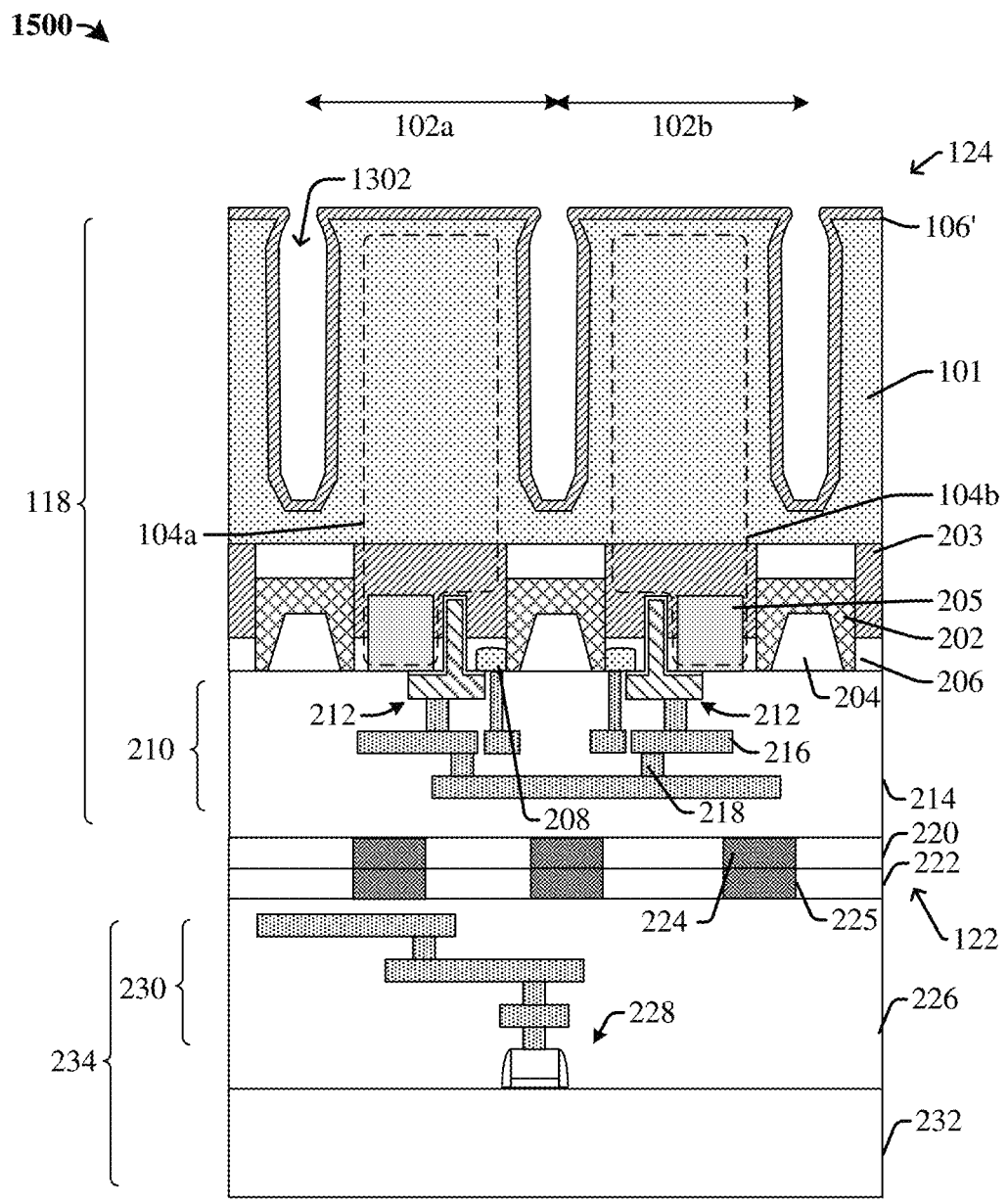

As illustrated by cross-sectional view 1500 of FIG. 15, in some embodiments, a first isolation epitaxial precursor 106' is formed into the deep trenches 1302 and over a backside 124 of the image sensing die 118. In some embodiments, the first isolation epitaxial precursor 106' may be formed by a low temperature epitaxial growth process, for example, an epitaxial growth process with a temperature lower than 450 degrees Celsius. Processing gases may comprise silane ($SiH_4$), disilane ($H_6Si_2$), or trisilane ($H_2Si(SiH_3)_2$), arsine ($AsH_3$), phosphine ($PH_3$), or other applicable gases. In some embodiments, arsine ($AsH_3$) and phosphine ($PH_3$) are configured to provide an n-dopant to the first isolation epitaxial precursor 106'.

The epitaxial growth process may be performed in a low pressure chemical vapor deposition epitaxial tool at a pressure less than approximately 200 torr to form an epitaxial doped layer as the first isolation epitaxial precursor 106' with a thickness in a range between approximately 29 nanometers and approximately 40 nanometers, such as around 30 nanometers. The forming temperature should not be higher than 450 degrees Celsius since a higher forming temperature would cause a lower dopant concentration and an increased roughness. The first isolation epitaxial precursor 106' is formed on the smoothened sidewall surfaces of the deep trenches 1302 and results in a better conformity than conventional beamline implant technique, which suffers shadowing effect for three-dimensional structure and thus cannot achieve desired conformity. The first isolation epitaxial precursor 106' may be formed with a delta doping. A concentration of the n-dopant (e.g., arsenic, phosphorous) can be in a range of from about $3\times10^{17}$ atoms per cubic centimeter to about $7\times10^{17}$ atoms per cubic centimeter, and may further be different than that of the image sensing element 104. A thicker first isolation epitaxial precursor 106' or a smaller concentration of dopants adversely affects the number of white pixels and/or the dark current of the image sensor.

Figure 16:
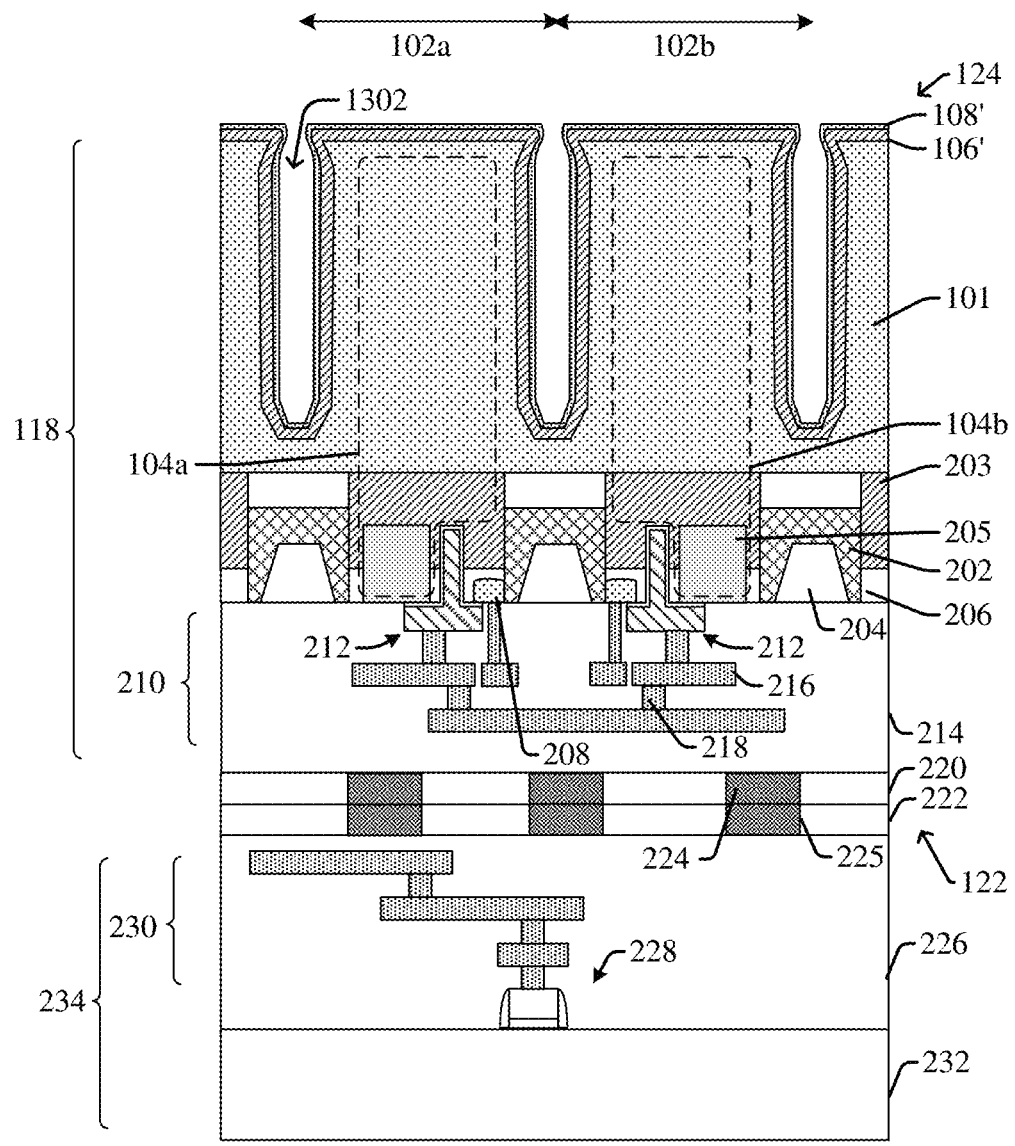

As illustrated by cross-sectional view 1600 of FIG. 16, in some embodiments, a second isolation epitaxial precursor 108' is formed over the and along sidewalls of the first isolation epitaxial precursor 106'. The second isolation epitaxial precursor 108' is formed into the deep trenches 1302. In some embodiments, the second isolation epitaxial precursor 108' is formed directly on and contacting the first isolation epitaxial precursor 106'. In some embodiments, the second isolation epitaxial precursor 108' may be formed by a low temperature epitaxial growth process, for example, an epitaxial growth process with a temperature lower than 450 degrees Celsius. Processing gases may comprise silane ($SiH_4$), disilane ($H_6Si_2$), or trisilane ($H_2Si(SiH_3)_2$), diborane ($B_2H_6$), or other applicable gases. In some embodiments, diborane ($B_2H_6$) is configured to provide a p-dopant to the second isolation epitaxial precursor 108'.

The epitaxial growth process may be performed in a low pressure chemical vapor deposition epitaxial tool at a pressure less than approximately 200 torr to form an epitaxial doped layer as the second isolation epitaxial precursor 108' with a thickness in a range between approximately 0.5 nanometers and approximately 3 nanometers, such as around 1 nanometer. The forming temperature should not be higher than 450 degrees Celsius since a higher forming temperature would cause a lower dopant concentration and an increased roughness. The second isolation epitaxial precursor 108' is formed on the sidewalls of the first isolation epitaxial precursor 106' and results in a better conformity than conventional beamline implant technique, which suffers shadowing effect for three-dimensional structure and thus cannot achieve desired conformity. The second isolation epitaxial precursor 108' may be formed with a delta doping. A concentration of the p-dopant (e.g., boron) can be in a range of from about $3\times10^{19}$ atoms per cubic centimeter to about $2\times10^{20}$ atoms per cubic centimeter. A thicker second isolation epitaxial precursor 108' or a smaller concentration of dopants adversely affects the number of white pixels and/or the dark current of the image sensor.

Figure 17:
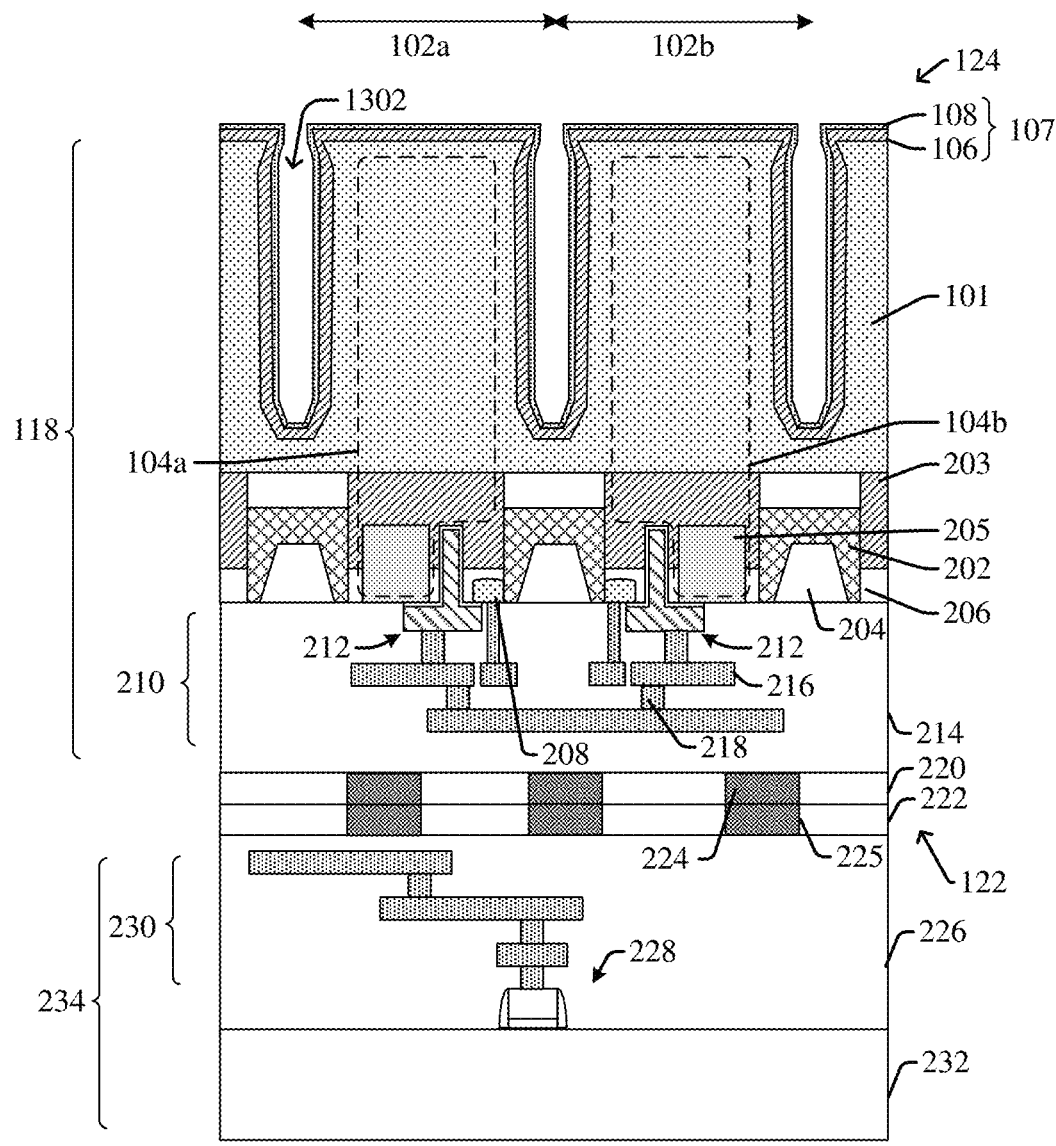

As shown in cross-sectional view 1700 of FIG. 17, in some embodiments, a dopant activation process is then performed on the first isolation epitaxial precursor 106' and the second isolation epitaxial precursor 108' to facilitate diffusion and to form an isolation epitaxial bi-layer 107 comprising the first isolation epitaxial layer 106 and the second isolation epitaxial layer 108. In some embodiments, the dopant activation process comprises or is a laser anneal process or a dynamic surface anneal process. As an example, the anneal may use a green laser, and the anneal temperature may be in a range between approximately 800° C. and approximately 1100° C. for a time in a range between approximately 10 nanoseconds and approximately 100 nanoseconds. The dopant activation process is beneficial to low thermal budget products, especially compared to other approaches such as a deposition process followed by a thermal drive-in process, which either can't provide enough junction depth or not acceptable for low thermal budget product because of the high temperature junction drive-in and anneal for damage recovery and dopant activation. In some embodiments, a pair of vertical sidewalls of the second isolation epitaxial layer 108 may be formed as a consequence of a higher epitaxial growth rate along the lateral plane (e.g., the (100) facet). This may form a pair of vertical inner sidewalls of the second isolation epitaxial layer 108, and in some embodiments, may facilitate formation of a subsequently formed high-k dielectric layer and a subsequently formed isolation filler structure. In some embodiments, the second isolation epitaxial layer may be more than 10 times thinner than the first isolation epitaxial layer to sustain the subsequently formed high-k dielectric layer.

Since the first isolation epitaxial layer 106 is a same doping type as the image sensing element 104, including the first isolation epitaxial layer as a part of the BDTI structure 112 increases the effective size of the image sensing element 104, thus increasing the amount of incident radiation that contributes to an electric signal generated by the image sensing element 104. This maintains the QE of the pixel regions 102a, 102b at a large enough value such that performance of the image sensor is not hindered. Additionally, since the second isolation epitaxial layer 108 is an opposite doping type as the first isolation epitaxial layer 106 and the image sensing element 104, the second isolation epitaxial layer 108 serves as a passivation layer for defects. This, in turn, facilitates depletion of the image sensing element 104 during operation, such that full well capacity is improved.

Figure 18:
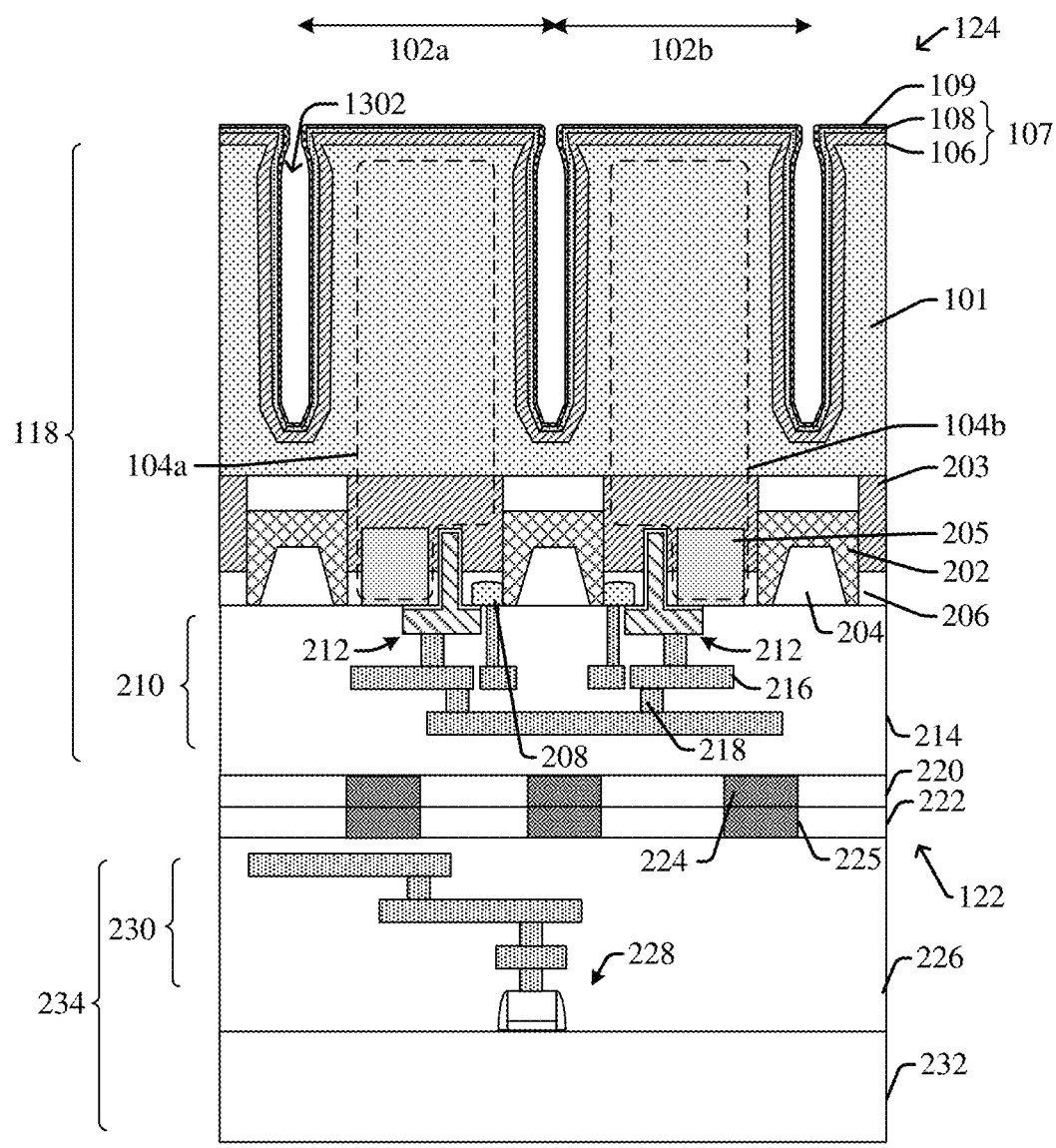

As illustrated by cross-sectional view 1800 of FIG. 18, in some embodiments, a high-k dielectric layer 109 is formed over the isolation epitaxial bi-layer 107 and along inner sidewalls of the isolation epitaxial bi-layer 107. In some embodiments, high-k dielectric layer 109 is formed directly on and contacting the second isolation epitaxial precursor 108'. In some embodiments, the high-k dielectric layer 109 may be deposited using a physical vapor deposition technique or a chemical vapor deposition technique.

Figure 19:
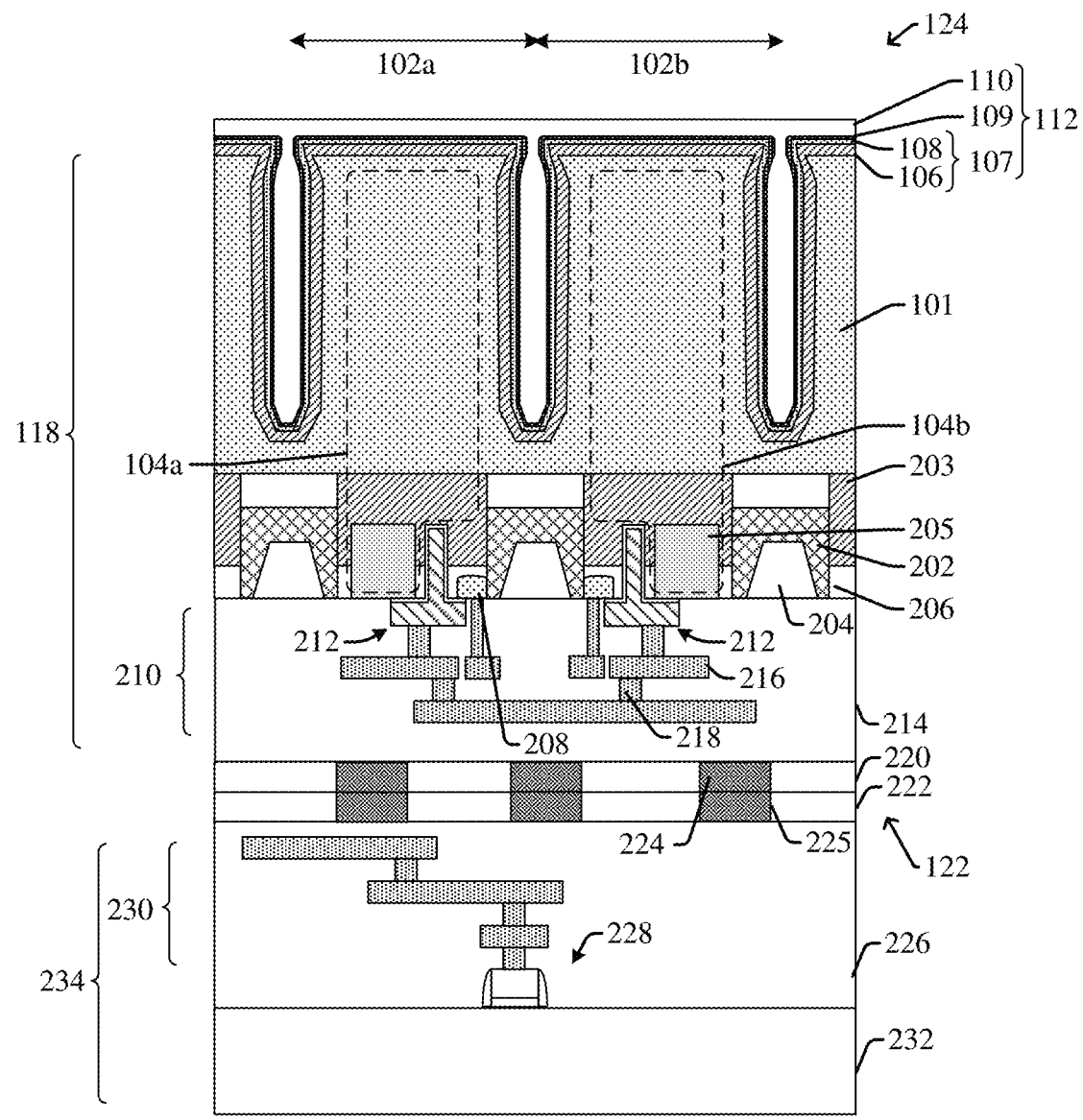

As illustrated by cross-sectional view 1900 of FIG. 19, in some embodiments, an isolation filler structure 110 is formed to fill a remainder of the deep trenches 1302. In some embodiments, a planarization process is performed after forming the isolation filler structure 110 to form a planar surface that extends along an upper surface of the second isolation epitaxial layer 108. In some alternative embodiments, the isolation epitaxial bi-layer 107, the high-k dielectric layer 109, and the isolation filler structure 110 may be subject to a planarization process that removes lateral portions of the isolation filler structure 110 the high-k dielectric layer 109, and isolation epitaxial bi-layer 107 directly overlying pixel regions 102a, 102b. In some embodiments, the isolation filler structure 110 may be deposited using a physical vapor deposition technique or a chemical vapor deposition technique. As a result, the BDTI structure 112 is formed in the image sensing die 118, extending from the backside 124 to a position within the array deep well 101. The BDTI structure 112 is formed between and isolate adjacent pixel regions 102a, 102b.

Figure 20:
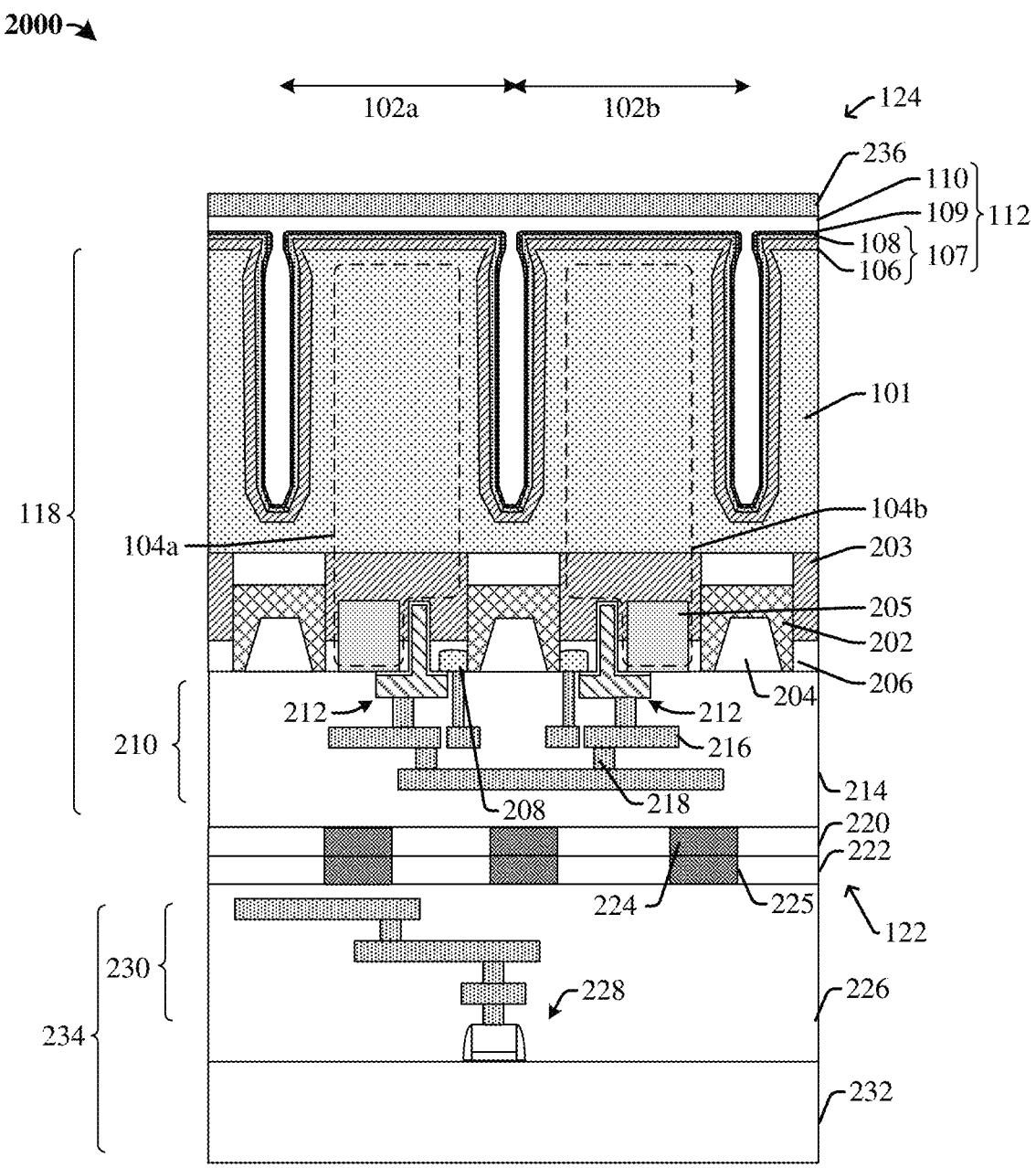

As illustrated by cross-sectional view 2000 of FIG. 20, a BARL 236 is formed over the backside 124 of the image sensing die 118. The BARL 236 is configured to reduce and/or prevent reflection of incident photons. In some embodiments, the BARL 236 may be formed by a deposition process such as, for example, PVD, CVD, or some other suitable formation process.

Figure 21:
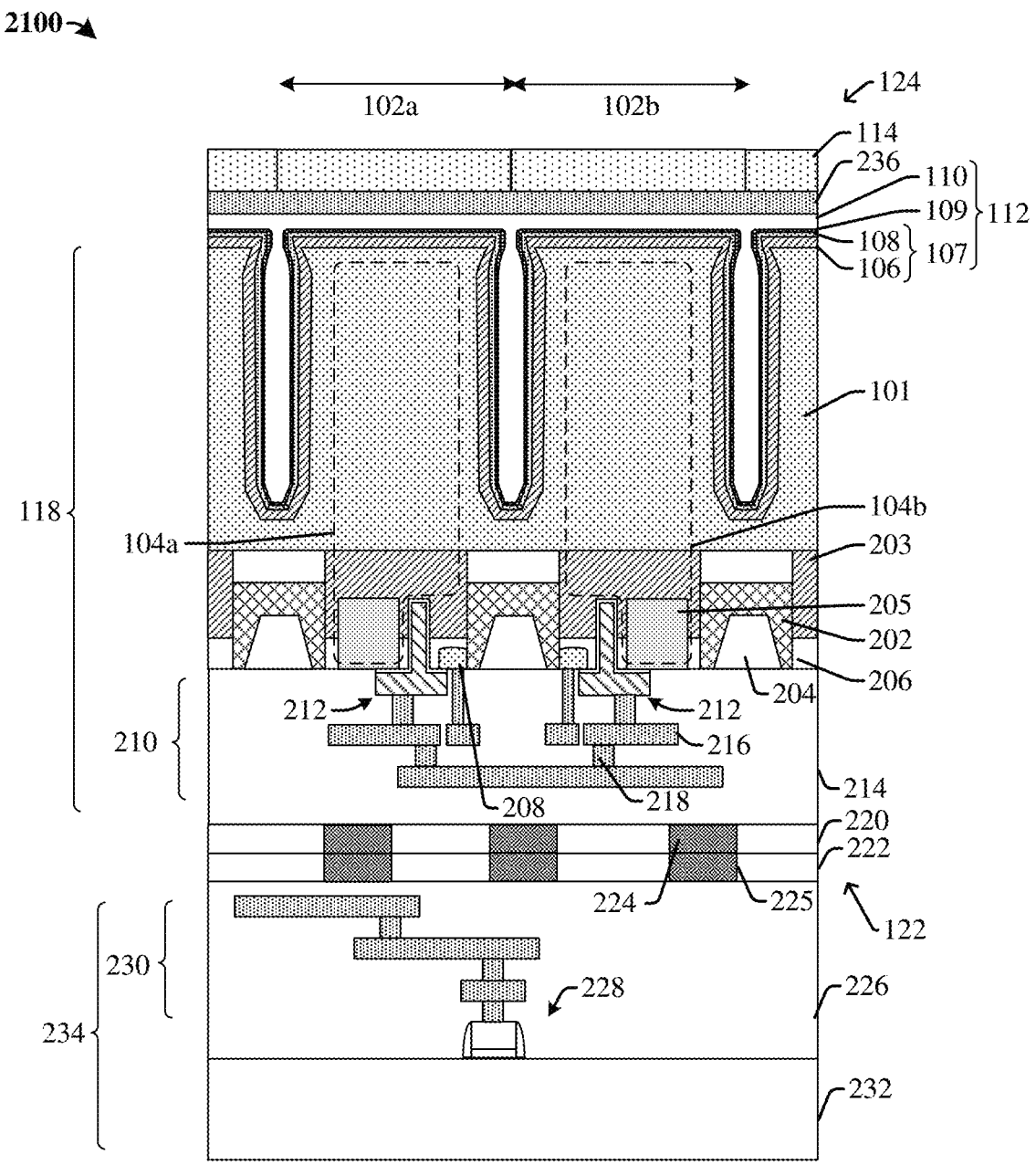

As illustrated by cross-sectional view 2100 of FIG. 21, in some embodiments, color filters 114 corresponding to pixel sensors are formed over corresponding pixel regions 102a, 102b. The color filters 114 are formed of a material that allows light of the corresponding color to pass therethrough, while blocking light of other colors. Further, the color filters 114 may be formed with assigned colors. For example, the color filters 114 are alternatingly formed with assigned colors of red, green, and blue. The color filters 114 may be symmetrical about vertical axes aligned with a center of the image sensing elements 104a, 104b of the corresponding pixel sensors. The process for forming the color filters 114 may include, for each of the different colors of the color assignments, forming a color filter layer and patterning the color filter layer. The color filter layer may be planarized subsequent to formation. The patterning may be performed by forming a photoresist layer with a pattern over the color filter layer, applying an etchant to the color filter layer according to the pattern of the photoresist layer, and removing the pattern photoresist layer.

Figure 22:
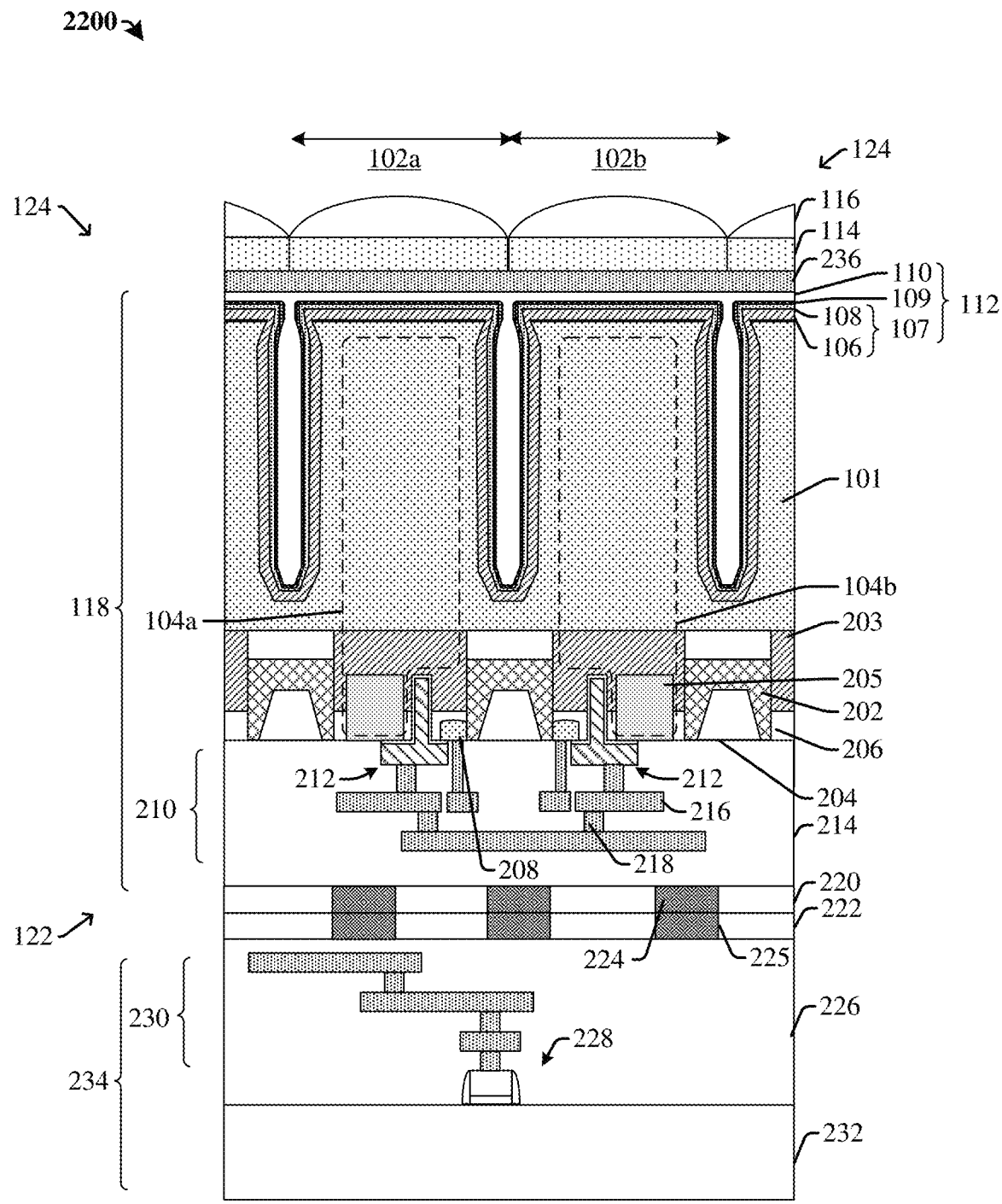

As illustrated by cross-sectional view 2200 of FIG. 22, in some embodiments, micro-lenses 116 corresponding to the pixel sensors are formed over the color filters 114 of the corresponding pixel sensors. In some embodiments, the plurality of micro-lenses 116 may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist, more light is exposed at a bottom of the curvature and less light is exposed at a top of the curvature), developed and baked to form a rounding shape. The micro-lenses 116 are then formed by selectively etching the micro-lens material according to the micro-lens template.

Figure 23:
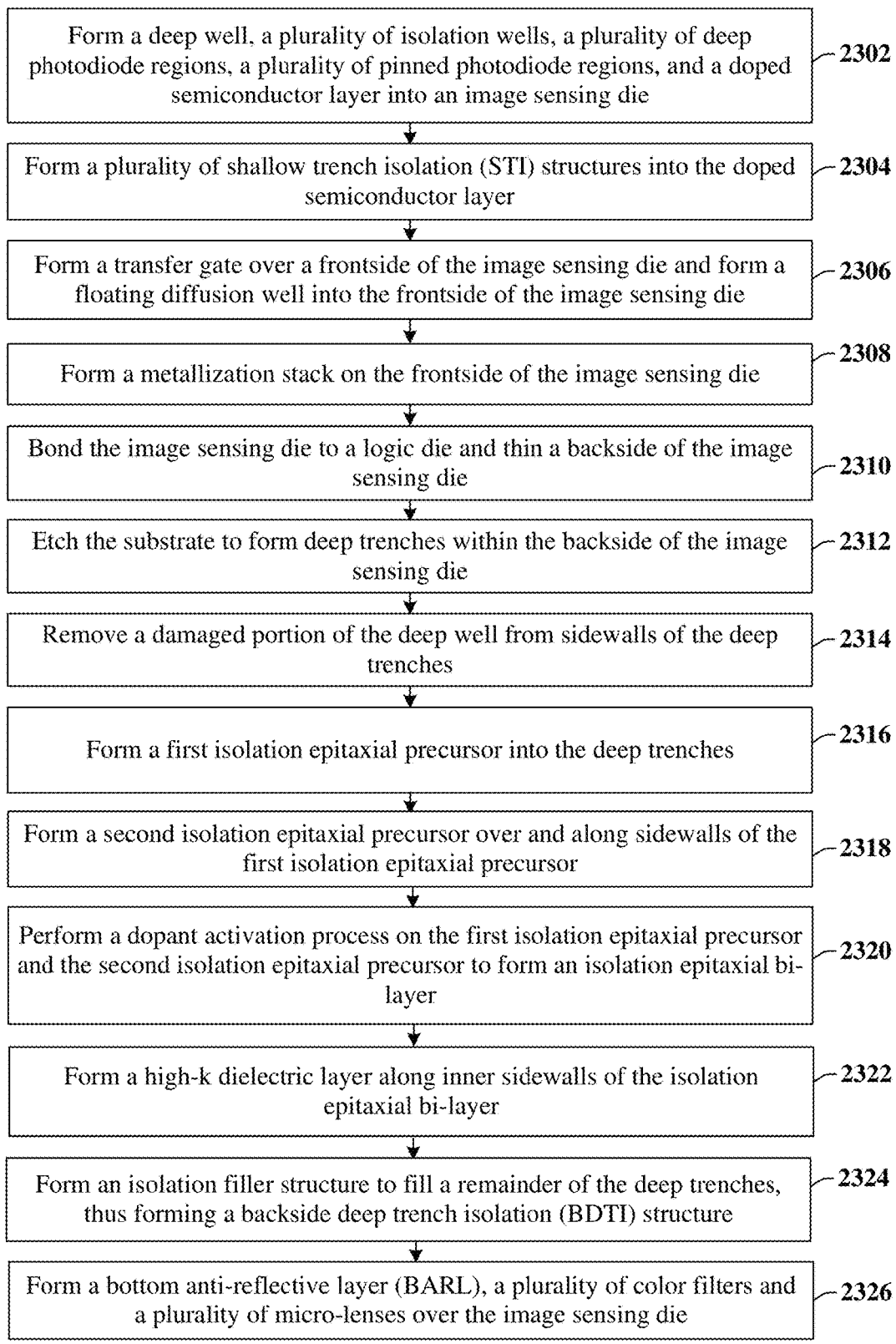
FIG. 23 illustrates a flow diagram of some embodiments of a method of forming an integrated chip comprising an image sensing die and a logic die bonded together where the image sensing die has an image sensing element surrounded by a BDTI structure with an isolation epitaxial bi-layer.

FIG. 23 illustrates a flow diagram 2300 of some embodiments of a method of forming an integrated chip comprising an image sensing die and a logic die bonded together where the image sensing die has an image sensing element surrounded by a BDTI structure with an isolation epitaxial bi-layer. In some embodiments, FIG. 23 may correspond to the method described in FIGS. 5-22.

While disclosed method of the flow diagram 2300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 2302, a deep well, a plurality of isolation wells, a plurality of deep photodiode regions, a plurality of pinned photodiode regions, and a doped semiconductor layer are formed an image sensing die. See, for example, FIGS. 5-8.

At act 2304, a plurality of STI structures is formed into the doped semiconductor layer. See, for example, FIG. 9.

At act 2306, a transfer gate is formed over a frontside of the image sensing die and a floating diffusion well is formed into the frontside of the image sensing die. See, for example, FIG. 10.

At act 2308, a metallization stack is formed on the frontside of the image sensing die. See, for example, FIG. 11.

At act 2310, the image sensing die is bonded to a logic die and a backside of the image sensing die is thinned. See, for example, FIG. 12.

At act 2312, the substrate is etched to form deep trenches within the backside of the image sensing die. See, for example, FIG. 13.

At act 2314, a damaged portion of the deep well is removed from sidewalls of the deep trenches. See, for example, FIG. 14.

At act 2316, a first isolation epitaxial precursor is formed into the deep trenches. See, for example, FIG. 15.

At act 2318, a second isolation epitaxial precursor is formed over and along sidewalls of the first isolation epitaxial precursor. See, for example, FIG. 16.

At act 2320, a dopant activation process is performed on the first isolation epitaxial precursor and the second isolation epitaxial precursor to form an isolation epitaxial bi-layer. See, for example, FIG. 17.

At act 2322, a high-k dielectric layer is formed along inner sidewalls of the isolation epitaxial bi-layer. See, for example, FIG. 18.

At act 2324, an isolation filler structure is formed to fill a remainder of the deep trenches, thus forming a BDTI structure. See, for example, FIG. 19.

At act 2326, a bottom anti-reflective layer (BARL), a plurality of color filters and a plurality of micro-lenses are formed over the image sensing die. See, for example, FIGS. 20-22.

Accordingly, in some embodiments, the present disclosure relates to an integrated chip, including a substrate, a first image sensing element and a second image sensing element arranged next to one another over the substrate, the first image sensing element and the second image sensing element having a first doping type, and a backside deep trench isolation (BDTI) structure arranged between the first and second image sensing elements and including a first isolation epitaxial layer setting an outermost sidewall of the BDTI structure and having the first doping type, a second isolation epitaxial layer arranged along inner sidewalls of the first isolation epitaxial layer and having a second doping type different than the first doping type, and an isolation filler structure filling between inner sidewalls of the second isolation epitaxial layer.

In other embodiments, the present disclosure relates to a method of forming an integrated chip, including forming a deep well comprising a first doping type into a substrate, forming a plurality of deep trenches within the deep well to separate the deep well into a plurality of image sensing elements, performing an etching process to remove an upper portion of the deep well exposed to the deep trenches and enlarge the deep trenches, performing a low-temperature epitaxial growth process to form a first isolation epitaxial layer of the first doping type within the deep trenches and to form a second isolation epitaxial layer of a second doping type different than the first doping type over the first isolation epitaxial layer, and filling remaining portions of the deep trenches with an isolation filler structure, wherein the first isolation epitaxial layer, the second isolation epitaxial layer, and the isolation filler structure form a backside deep trench isolation (BDTI) structure to isolate image sensing elements from one another.

In yet other embodiments, the present disclosure relates to an integrated chip, including a substrate, a plurality of image sensing elements with a first doping type arranged over the substrate, and a backside deep trench isolation (BDTI) structure separating the plurality of image sensing elements and including an isolation filler structure and an isolation epitaxial bi-layer disposed along an outer sidewall of the isolation filler structure and including a first isolation epitaxial layer with the first doping type and a dopant concentration different than that of the plurality of image sensing elements arranged under and along outer sidewalls of the isolation filler structure and a second isolation epitaxial layer with a second doping type different than the first doping type arranged between the first isolation epitaxial layer and the isolation filler structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
forming a deep well comprising a first doping type into a substrate;
forming a plurality of deep trenches within the deep well to separate the deep well into a plurality of image sensing elements;
performing an etching process to remove an upper portion of the deep well exposed to the deep trenches and enlarge the deep trenches;
performing a low-temperature epitaxial growth process to form a first isolation epitaxial layer of the first doping type within the deep trenches and to form a second isolation epitaxial layer of a second doping type different than the first doping type over the first isolation epitaxial layer; and
filling remaining portions of the deep trenches with an isolation filler structure, wherein the first isolation epitaxial layer, the second isolation epitaxial layer, and the isolation filler structure form a backside deep trench isolation (BDTI) structure to isolate image sensing elements from one another,
wherein the first isolation epitaxial layer and the second isolation epitaxial layer are formed by forming a first isolation epitaxial precursor and a second isolation epitaxial precursor followed by performing a laser anneal process on the first isolation epitaxial precursor and the second isolation epitaxial precursor.

2. The method of claim 1, wherein the etching process removes a damaged portion of the deep well.

3. The method of claim 1, wherein the etching process increases a width of the deep trenches by at least 40 nanometers.

4. The method of claim 1, wherein the low-temperature epitaxial growth process is performed at a temperature of less than 450 degrees Celsius.

5. The method of claim 1, wherein an upper surface of the deep well overhangs the BDTI structure.

6. The method of claim 1, wherein the first isolation epitaxial layer is formed with a thickness that is more than 10 times greater than that of the second isolation epitaxial layer.

7. The method of claim 1, further comprising:
forming a high-k dielectric layer between the second isolation epitaxial layer and the isolation filler structure.

8. A method of forming an integrated chip, comprising:
forming an image sensing layer over a substrate, the image sensing layer having a first doping type; and
forming a backside deep trench isolation (BDTI) structure in the image sensing layer, the BDTI structure separating the image sensing layer into a first image sensing element and a second image sensing element, wherein forming the BDTI structure comprises:
forming a deep trench to separate the image sensing layer;
forming a first isolation epitaxial layer on a sidewall of the deep trench setting an outermost sidewall of the BDTI structure and having the first doping type;
forming a second isolation epitaxial layer along an inner sidewall of the first isolation epitaxial layer and having a second doping type different than the first doping type; and
forming an isolation filler structure filling between inner sidewalls of the second isolation epitaxial layer wherein the first isolation epitaxial layer is formed with a thickness that is more than 10 times greater than that of the second isolation epitaxial layer.

9. The method of claim 8, wherein the first doping type is n-type, and wherein the second doping type is p-type.

10. The method of claim 8, wherein the isolation filler structure is formed with a dielectric material.

11. The method of claim 8, wherein the first isolation epitaxial layer is formed with a thickness greater than the second isolation epitaxial layer.

12. The method of claim 8, wherein a dopant concentration of the first isolation epitaxial layer is greater than that of the first and second image sensing elements.

13. The method of claim 8, wherein a dopant concentration of the first isolation epitaxial layer is less than that of the first and second image sensing elements.

14. The method of claim 8, further comprising forming a high-k dielectric layer over the second isolation epitaxial layer.

15. The method of claim 8, wherein the second isolation epitaxial layer is formed on the inner sidewall of the first isolation epitaxial layer and extends laterally to directly above the first and second image sensing elements in vertical direction.

16. The method of claim 8, wherein the first isolation epitaxial layer and the second isolation epitaxial layer are formed by forming a first isolation epitaxial precursor and a second isolation epitaxial precursor followed by performing a laser anneal process on the first isolation epitaxial precursor and the second isolation epitaxial precursor.

17. A method of forming an integrated chip, comprising:
forming an image sensing layer over a substrate, the image sensing layer having a first doping type; and
forming a backside deep trench isolation (BDTI) structure in the image sensing layer, the BDTI structure separating the image sensing layer into a plurality of image sensing elements, wherein forming the BDTI structure comprises:
forming a plurality of deep trenches to separate the image sensing layer;
forming an isolation epitaxial bi-layer along sidewall and upper surfaces of the plurality of deep trenches, comprising:
forming a first isolation epitaxial layer with the first doping type and a dopant concentration different than that of the plurality of image sensing elements above and along the sidewall and upper surfaces of the plurality of deep trenches; and
forming a second isolation epitaxial layer with a second doping type different than the first doping type on top of the first isolation epitaxial layer; and
forming an isolation filler structure filling between and directly contacting inner sidewalls of the isolation epitaxial bi-layer.

18. The method of claim 17, wherein the first doping type is n-type, and wherein the second doping type is p-type.

19. The method of claim 17, wherein the dopant concentration ranges from approximately $3 \times 10^{17}$ atoms per cubic centimeter to approximately $7 \times 10^{17}$ atoms per cubic centimeter.

20. The method of claim 17, wherein the first isolation epitaxial layer is formed with a thickness that is at least three times greater than that of the second isolation epitaxial layer.

* * * * *